United States Patent
Ogasawara et al.

(10) Patent No.: US 8,174,597 B2
(45) Date of Patent: May 8, 2012

(54) SOLID-STATE IMAGING DEVICE AND SIGNAL PROCESSING SYSTEM

(75) Inventors: Hidehiko Ogasawara, Chiba (JP); Toshiyuki Sekiya, Tokyo (JP)

(73) Assignee: Sony Corporation, Tokyo (JP)

( * ) Notice: Subject to any disclaimer, the term of this patent is extended or adjusted under 35 U.S.C. 154(b) by 371 days.

(21) Appl. No.: 12/572,452

(22) Filed: Oct. 2, 2009

(65) Prior Publication Data

US 2010/0091152 A1 Apr. 15, 2010

(30) Foreign Application Priority Data

Oct. 10, 2008 (JP) .................... 2008-264584

(51) Int. Cl.
- *H04N 3/14* (2006.01)
- *H04N 5/225* (2006.01)
- *H01L 27/00* (2006.01)
- *H01L 31/062* (2012.01)
- *H01L 31/0232* (2006.01)
- *G01N 21/86* (2006.01)
- *G03H 1/02* (2006.01)

(52) U.S. Cl. ............... 348/294; 348/207.99; 348/207.1; 250/208.1; 250/559.13; 359/27; 257/291; 257/432

(58) Field of Classification Search ............... 348/207.1, 348/207.99–376; 250/208.1, 214.1, 214 R, 250/559.13; 359/298, 27, 237–239, 248; 257/432–435, 291, 431

See application file for complete search history.

(56) References Cited

U.S. PATENT DOCUMENTS

| | | | |
|---|---|---|---|
| 6,026,245 A * | 2/2000 | Fujii et al. ..................... 396/85 |
| 2002/0070739 A1* | 6/2002 | Dishongh et al. ............. 324/752 |
| 2006/0240586 A1* | 10/2006 | Kobayashi et al. ............. 438/26 |
| 2010/0091128 A1* | 4/2010 | Ogasawara et al. ........ 348/222.1 |
| 2010/0091144 A1* | 4/2010 | Hidehiko et al. ............. 348/243 |
| 2010/0091150 A1* | 4/2010 | Ogasawara et al. ........... 348/294 |
| 2010/0091151 A1* | 4/2010 | Hidehiko et al. ............. 348/294 |

FOREIGN PATENT DOCUMENTS

| | | |
|---|---|---|
| JP | 2004-112422 | 4/2004 |
| JP | 2004-219882 | 8/2004 |
| JP | 2006-191465 | 7/2006 |
| JP | 2006-196972 * | 7/2006 |

OTHER PUBLICATIONS

U.S. Appl. No. 12/554,506, filed Sep. 4, 2009, Ogasawara, et al.
U.S. Appl. No. 12/555,235, filed Sep. 8, 2009, Ogasawara, et al.
U.S. Appl. No. 12/565,369, filed Sep. 23, 2009, Ogasawara, et al.
U.S. Appl. No. 12/572,637, filed Oct. 2, 2009, Ogasawara, et al.

* cited by examiner

*Primary Examiner* — Lin Ye
*Assistant Examiner* — Marly Camargo
(74) *Attorney, Agent, or Firm* — Oblon, Spivak, McClelland, Maier & Neustadt, L.L.P.

(57) ABSTRACT

A solid-state imaging device includes: a pixel portion configured to convert light into an electric signal; a substrate where the pixel portion is formed; an optical communication unit configured to convert a signal read out from the pixel portion into an optical signal, and outputs the optical signal, which is disposed in one surface where the pixel portion is formed of the substrate; and a light shielding portion configured to shield, of signal light to be output from the optical communication unit, light that directs to the pixel portion, and light to be leaked from the optical communication unit, which is disposed around the optical communication unit.

10 Claims, 32 Drawing Sheets

SOLID-STATE IMAGING DEVICE AND SIGNAL PROCESSING SYSTEM

BACKGROUND OF THE INVENTION

1. Field of the Invention

The present invention relates to a solid-state imaging device which converts an optical image into an electric signal, and a signal processing system including this solid-state imaging device, and more specifically, relates to a solid-state imaging device which converts an optical image into an electric signal, and a signal processing system including this solid-state imaging device, whereby a pixel signal to be read out from the solid-state imaging device can be output as an optical signal.

2. Description of the Related Art

Increased speed and integration of circuit substrates has advanced, and accordingly, there is pressing demand for handling of problems such as signal delay, occurrence of EMI, and so forth. Optical wiring technology has attracted attention wherein signal delay, signal deterioration, and electromagnetic interference noise irradiated from wiring that have been problems due to electric wiring are solved, and high-speed transmission is enabled.

Technology using such optical wiring technology has been proposed wherein a lens configured so as to be detachable from a camera main unit includes a solid-state imaging device, whereby a signal to be output from the solid-state imaging device can be propagated to the camera main unit (e.g., see Japanese Unexamined Patent Application Publication No. 2006-196972).

SUMMARY OF THE INVENTION

High-speed transmission of a signal can be executed by using the optical wiring technology. However, with the technology described in Japanese Unexamined Patent Application Publication No. 2006-196972, only a configuration has been disclosed wherein light emitting elements are mounted on a substrate on which a solid-state imaging device has been mounted, and influence that light output from a light emitting element, and leakage light provide is not taken into consideration.

It has been found to be desirable to a solid-state imaging device and a signal processing system which enable a pixel signal to be read out from a pixel portion to be transmitted at high speed using an optical signal, while suppressing influence of light due to optical communication.

According to an embodiment of the present invention, a solid-state imaging device includes: a pixel portion configured to convert light into an electric signal; a substrate where the pixel portion is formed; an optical communication unit configured to convert a signal read out from the pixel portion into an optical signal, and outputs the optical signal, which is disposed in one surface where the pixel portion is formed of the substrate; and a light shielding portion configured to shield, of signal light to be output from the optical communication unit, light that directs to the pixel portion, and light to be leaked from the optical communication unit, which is disposed around the optical communication unit.

According to an embodiment of the present invention, A signal processing system includes: an optical apparatus including a solid-state imaging device configured to convert incident light into an electric signal, and an optical element configured to allow the solid-state imaging device to input light; and a signal processing apparatus to which the optical apparatus is connected, with the solid-state imaging device including a pixel portion configured to convert light into an electric signal, a substrate where the pixel portion is formed, an optical communication unit configured to convert a signal read out from the pixel portion into an optical signal, and outputs the optical signal, which is disposed in one surface where the pixel portion is formed of the substrate, and a light shielding portion configured to shield, of signal light to be output from the optical communication unit, light that directs to the pixel portion, and light to be leaked from the optical communication unit, which is disposed around the optical communication unit.

With the above configurations, a electric signal photoelectric-converted by light inputting to the pixel portion is read out, the electric signal input to the optical communication unit is converted into an optical signal, and the signal light is output. With the signal light output from the optical communication unit, components that direct to the pixel portion are shielded at the light shielding portion, and are not input to the pixel portion. Also, light leaked from the optical communication unit is shielded at the light shielding portion, and is not input to the pixel portion.

With the above configurations, the pixel signal read out from the pixel portion is transmitted as an optical signal, and also the light shielding portion is included in the optical communication unit. Thus, the signal light output from the optical communication unit, and the light leaked from the optical communication unit can be prevented from inputting to the pixel portion. Also, the light input to the pixel portion can be prevented from mixing with the signal light output from the optical communication unit.

DESCRIPTION OF THE PREFERRED EMBODIMENTS

Description will be made below regarding embodiments of a solid-state imaging device of the present invention, an optical apparatus including the solid-state imaging device, a signal processing apparatus to which the optical apparatus is connected, and a signal processing system including the optical apparatus and the signal processing apparatus.

Figure 1:
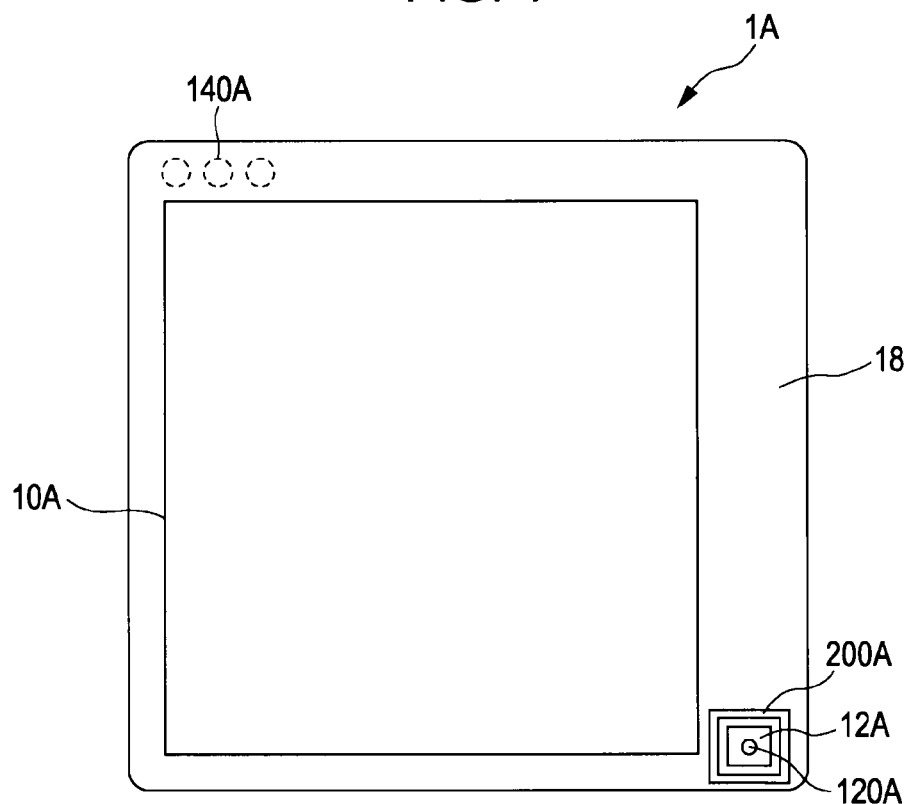
FIG. 1 is a schematic plan view illustrating an example of a solid-state imaging device according to a first embodiment.
Figure 2:
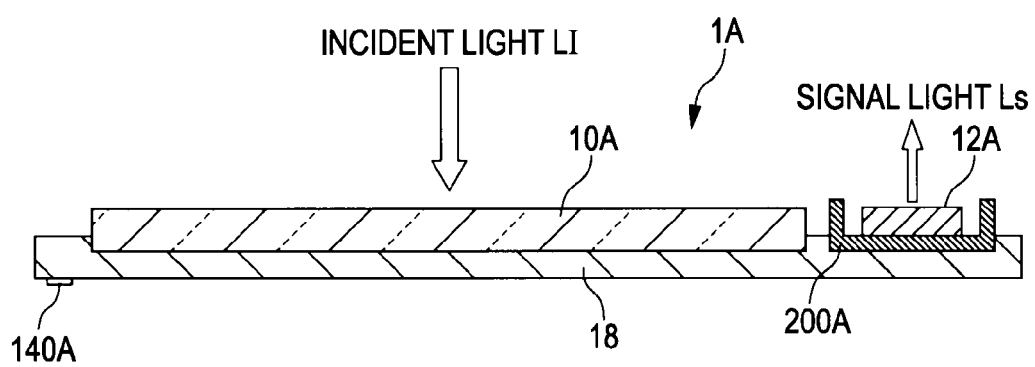
FIG. 2 is a schematic cross-sectional view illustrating an example of the solid-state imaging device according to the first embodiment.
Figure 3:
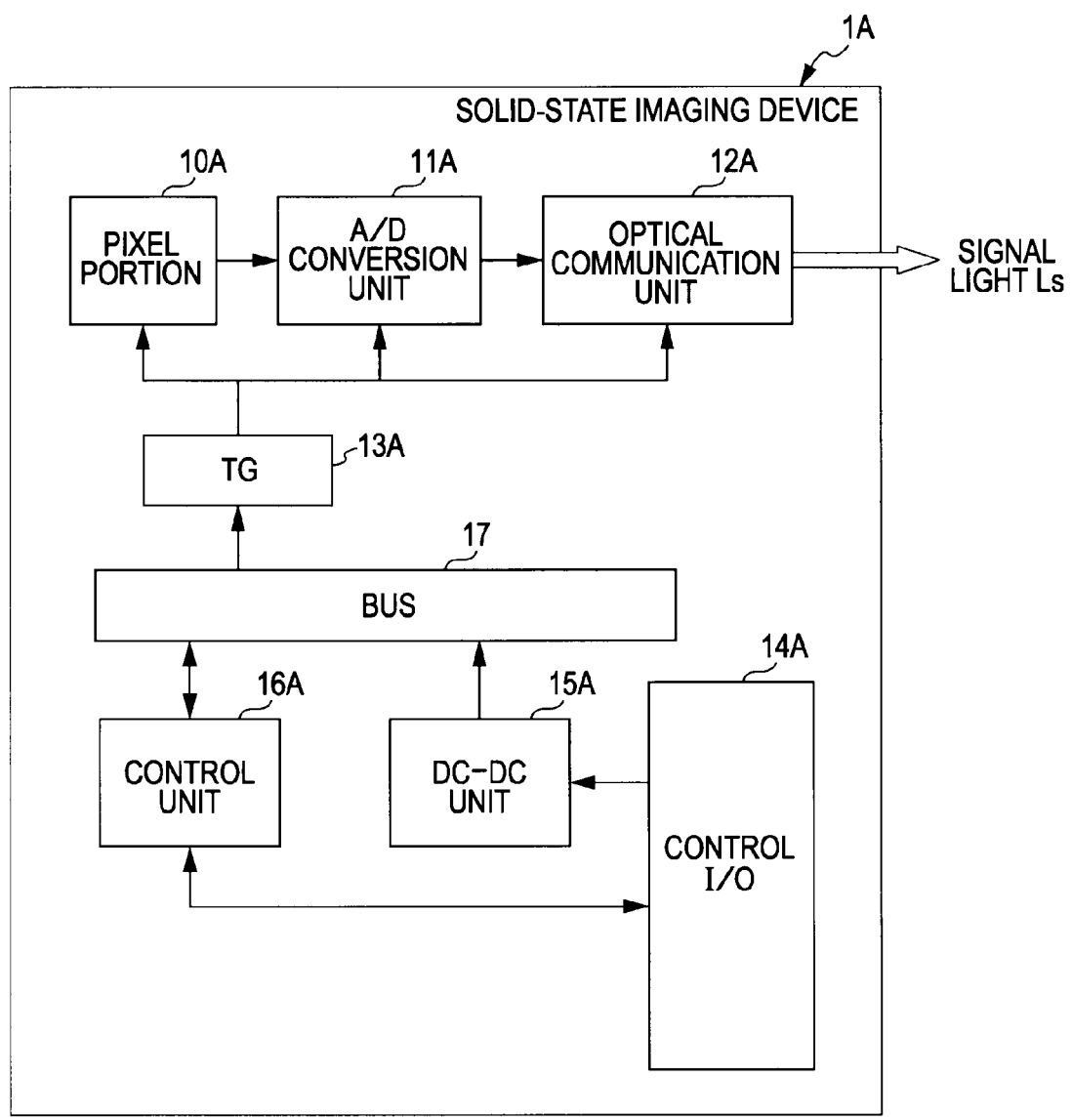
FIG. 3 is a functional block diagram illustrating an example of functions used for realizing the solid-state imaging device according to each of embodiments.

Configuration Example of Solid-State Imaging Device According to First Embodiment FIG. 1 is a schematic plan view illustrating an example of a solid-state imaging device according to a first embodiment, and FIG. 2 is a schematic cross-sectional view illustrating an example of the solid-state imaging device according to the first embodiment. Also, FIG. 3 is a functional block diagram illustrating an example of functions used for realizing the solid-state imaging device according to each of embodiments.

A solid-state imaging device 1A according to the first embodiment is configured of a CMOS (Complementary Metal Oxide Semiconductor) image sensor, or a CCD (Charge Coupled Device) image sensor. The solid-state imaging device 1A includes a pixel portion 10A which converts light into an electric signal to output this. With the pixel portion 10A, pixels which convert light into electricity are arrayed two-dimensionally or one-dimensionally, from which an electric signal according to the intensity of incident light LI is output.

The solid-state imaging device 1A includes an A/D conversion unit 11A which converts the electric signal output from the pixel portion 10A into a digital signal, and an optical communication unit 12A which converts the electric signal digitized at the A/D conversion unit 11A into an optical signal to output this.

The optical communication unit 12A includes a single or multiple optical output units 120A which convert an electric signal into an optical signal. The optical communication unit 12A includes a self-emitting light emitting element as a first embodiment of the optical output unit 120A, for example, such as a semiconductor laser (LD) or the like which emits light by voltage being applied thereto. With a light emitting element such as a semiconductor laser or the like, light can be modulated using an electric signal due to change in applied voltage or the like. Thus, the optical communication unit 12A modulates self-luminous light based on the electric signal converted into a digital signal at the A/D conversion unit 11A, thereby outputting signal light Ls based on pixel data read out from the pixel portion 10A.

Also, the optical communication unit 12A includes an optical modulator as a second embodiment of the light output 120A, which externally modulates light that has externally been input and transmitted or reflected, based on the electric signal due to change in voltage or the like. With the optical communication unit 12A, external fixed light is input to the optical modulator, and also the electric signal converted into a digital signal at the A/D conversion unit 11A is input to the optical modulator. Thus, the optical communication unit 12A modulates light that has been input externally, based on the electric signal input from the A/D conversion unit 11A, thereby outputting signal light Ls based on the pixel data read out from the pixel portion 10A.

The solid-state imaging device 1A includes a timing generator (TG) 13A which generates a driving clock (CLK) according to a mode of operation, and supplies this to each functional block of the pixel portion 10A, A/D conversion unit 11, and optical communication unit 12A. Also, the solid-state imaging device 1A includes a control I/O 14A where input/output of a control signal or the like is executed, a DC-DC unit 15A which supplies power, and a control unit 16A which controls readout of pixel data. The control unit 16A, DC-DC unit 15A, and timing generator 13A are connected to a bus 17, where exchange of a control signal or data is executed.

The control unit 16A controls the DC-DC unit 15A to switch on/off of the power of the solid-state imaging device 1A. Also, the control unit 16A generates a driving clock at the timing generator 13A to supply this to the pixel portion 10A, A/D conversion unit 11A, and optical communication unit 12A, and operates the pixel portion 10A, A/D conversion unit 11A, and optical communication unit 12A in sync with the driving clock.

The pixel portion 10A, A/D conversion unit 11A, and optical communication unit 12A synchronize input/output of a signal using the driving clock supplied from the timing generator 13A. With the pixel portion 10A, pixel data according to the image of incident light is read out as an electric signal. With the A/D conversion unit 11A, the pixel data read out from the pixel portion 10A is input thereto, converted into a digital signal, and is output. With the optical communication unit 12A, the electric signal read out from the pixel portion 10A, and converted into a digital signal at the A/D conversion unit 11A is input thereto, converted into an optical signal based on the pixel data, and signal light Ls is output.

With the solid-state imaging device 1A, the pixel portion 10A, A/D conversion unit 11A, optical communication unit 12A, timing generator 13A, DC-DC unit 15A, and control unit 16A are formed integrally on a substrate 18 configured of silicon (Si). The solid-state imaging device 1A is configured as one chip by using semiconductor manufacturing processes to form such components integrally.

With the solid-state imaging device 1A, the pixel portion 10A is formed on one surface of the substrate 18. With the pixel portion 10A, light is input from one face side of the substrate 18. Also, with the solid-state imaging device 1A, the A/D conversion unit 11A, the DC-DC unit 15A, and control unit 16A where input/output of an electric signal and power is executed are formed on one face side of the substrate 18. Further, with the solid-sate imaging device 1A, the optical communication unit 12A is formed on one face of the substrate 18. Also, with the solid-sate imaging device 1A, electrode pads 140A which are electrode portions to be connected to the control I/O 14A are formed on the rear surface of the substrate 18. The solid-state imaging device 1A transmits a pixel signal by optical communication, and accordingly, electrode pads used for transmitting a pixel signal externally by way of an electric signal do not have to be provided. Therefore, the electrode pads 140A are made up of three of a power line, a GND line, and a control line. Note that an arrangement may be made wherein the electrode pads 140A are formed on the surface of the substrate 18.

The solid-state imaging device 1A includes a light shielding portion 200A around the optical communication units 12A. The light shielding portion 200A is configured of a material which does not transmit at least light having an oscillation wavelength with a configuration wherein the optical communication unit 12A includes a self-emitting light emitting element. The light shielding portion 200A occupies a position and has a shape such that signal light and leakage light output from the optical communication unit 12A are not input to the pixel portion 10A directly, and is disposed around the optical communication unit 12A. For example, in the case that there are provided an light emitting portion of the optical communication unit 12A, an electrode where input/output is executed externally, and so forth, the light shielding portion 200A is configured so as to cover a portion other than the electrode. Also, the light shielding portion 200A may be configured of a material which reflects or refracts light having an oscillation wavelength. For example, an arrangement may be made wherein the light shielding portion 200A is disposed a position where light that directs to the pixel 10A of signal light, and leakage light output from optical communication unit 12A are input, and the input light is distributed by being reflected or refracted in a direction opposite to the pixel portion 10A.

For example, in the case of employing an edge-emitting semiconductor laser as a light emitting element, the light shielding portion 200A is configured so as to cover a portion other than the light emitting portion of the upper face which is the light emitting face of the optical communication unit 12A. For example, the light shielding portion 200A is configured so as to cover the lower face and side face of the optical communication unit 12A. Thus, the light leaked from the lower face of the optical communication unit 12A can be shielded so as not to pass through the substrate 18, whereby the leakage light Ln from the optical communication unit 12A can be prevented from inputting to the pixel portion 10A as stray light. Similarly, light leaked from other than the lower face of the optical communication unit 12A can also be shielded.

Figure 4:
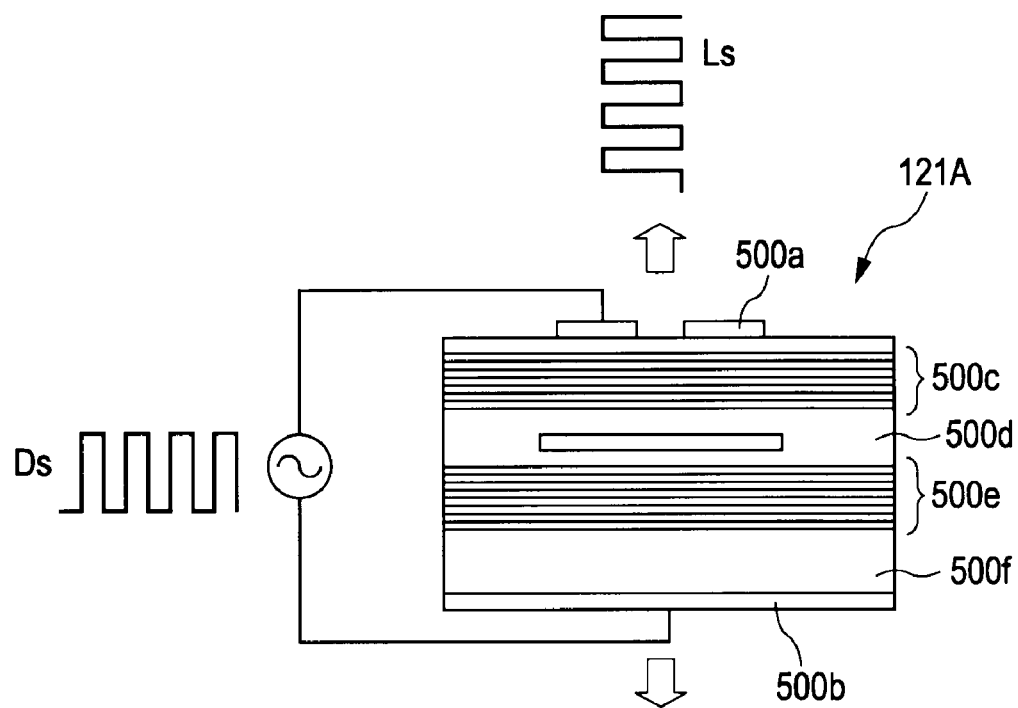
FIG. 4 is a configuration diagram illustrating an example of an optical communication unit of a solid-state imaging device.

Configuration Example of Optical Communication Unit of Solid-State Imaging Device FIG. 4 is a configuration diagram illustrating an example of the optical communication unit of the solid-state imaging device. The optical communication unit 12A of the solid-state imaging device according to the first embodiment includes a self-emitting light emitting element as the optical output unit 120A. For example, a surface-emitting semiconductor laser (VCSEL: Vertical Cavity Surface Emitting Laser) 121A is employed as the self-emitting light emitting element, which emits light in the vertical direction as to the surface of the substrate.

With the surface-emitting semiconductor laser 121A, an upward black reflecting mirror (DBR mirror) 500c, an active layer 500d, a downward black reflecting mirror (DBR mirror) 500e, and an n-type semiconductor substrate 500f are layered between a p-type electrode 500a and an n-type electrode 500b. With the surface-emitting semiconductor laser 121A, the upward black reflecting mirror 500c and the downward black reflecting mirror 500e which are made up of a dielectric multilayer are formed above and below the active layer 500d, whereby a resonator is configured between the mirrors.

Next, the principle of operation of the surface-emitting semiconductor laser 121A will be described.

(1) Voltage is applied to the p-type electrode 500a and the n-type electrode 500b, and current is externally sent, thereby causing an inverted distribution state at an energy level of the active layer 500d.

(2) A photon having energy corresponding to an energy gap is spontaneously emitted at the active layer 500d, and the photon thereof causes induced emission, thereby amplifying the light.

(3) The light is reflected at the mirrors above and below the active layer 500d, and a portion thereof is guided to the inside of the active layer 500d again, and is amplified by induced emission.

(4) A portion of the amplified light is passed through the edge face at the p-type electrode 500a side and emitted externally.

Thus, 1 and 0 of the digital signal to be output from the A/D conversion unit 11A are correlated with on and off of voltage, which represents on and off of light, and accordingly, modulation is realized. Note that an edge-emitting semiconductor laser, LED (Light Emitting Diode), or the like may be employed as the self-emitting light emitting element.

Figure 5:
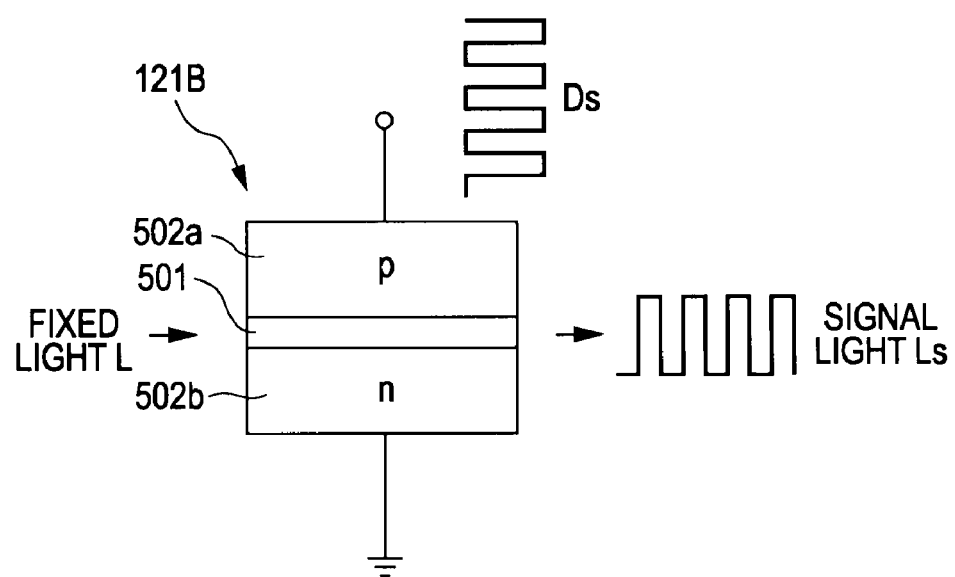
FIG. 5 is a configuration diagram illustrating another example of an optical communication unit of a solid-state imaging device.
Figure 6:
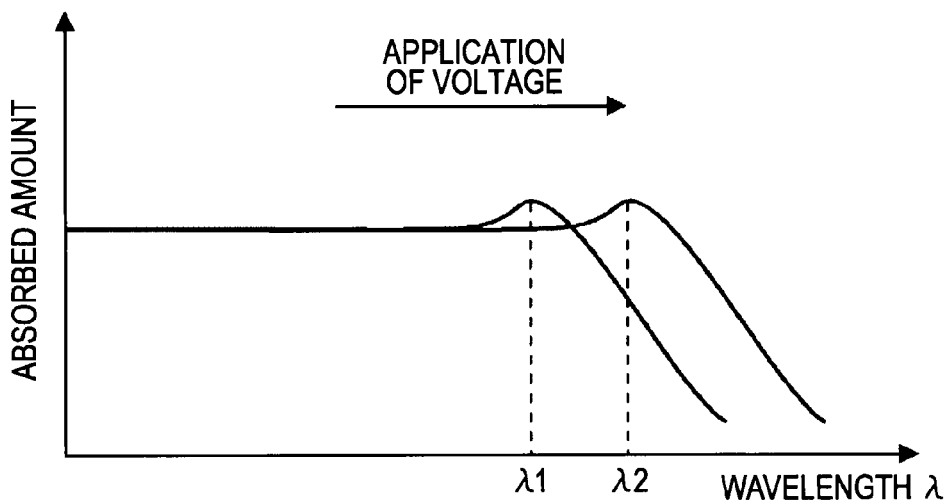
FIG. 6 is a graph illustrating relationship between applied voltage and the absorption amount of light.

FIG. 5 is a configuration diagram illustrating another example of the optical communication unit of the solid-state imaging device, and FIG. 6 is a graph illustrating relationship between applied voltage and the absorption amount of light. The optical communication unit 12A of the solid-state imaging device 1A includes an external-modulating optical modulator as the optical output unit 120A. The optical communication unit 12A includes an electroabsorption optical modulator 121B as an external-modulating optical modulator. The electroabsorption optical modulator 121B takes advantage of a phenomenon wherein upon an electric field being applied to the fine structure of a semiconductor called as a quantum well, the band structure of the semiconductor is changed, and the absorption amount of light is changed.

The electroabsorption optical modulator 121B has a configuration wherein a waveguide layer 501 having a multi-quantum well structure is sandwiched with a P layer 502a and an N layer 502b. With regard to the optical absorption amount of the waveguide layer 501 at the electroabsorption optical modulator 121B, the absorption band is shifted such as shown in FIG. 6 by bias voltage. Thus, for example, in the case that light having a wavelength of λ2 is input to the waveguide layer 501, the light is absorbed at the time of voltage being applied, and the light is transmitted at the time of no voltage being applied, and accordingly, the intensity of the light input to the waveguide layer 501 is modulated by loss being changed according to the applied voltage.

With the solid-state imaging device 1A, the voltage corresponding to the electric signal output from the A/D conversion unit 11A is applied to the electroabsorption optical modulator 121B, whereby modulation of the light is realized. Therefore, the optical communication unit 12A of the solid-state imaging device 1A is configured such that the voltage due to an electric signal converted into a digital signal at the A/D conversion unit 11A and output is applied to the P layer 502a and the N layer 502b of the electroabsorption optical modulator 121B.

Thus, with the optical communication unit 12A of the solid-state imaging device 1A, fixed light externally input is modulated based on an electric signal Ds read out from the pixel portion 10A and digitized, and is output as signal light Ls.

Figure 7:
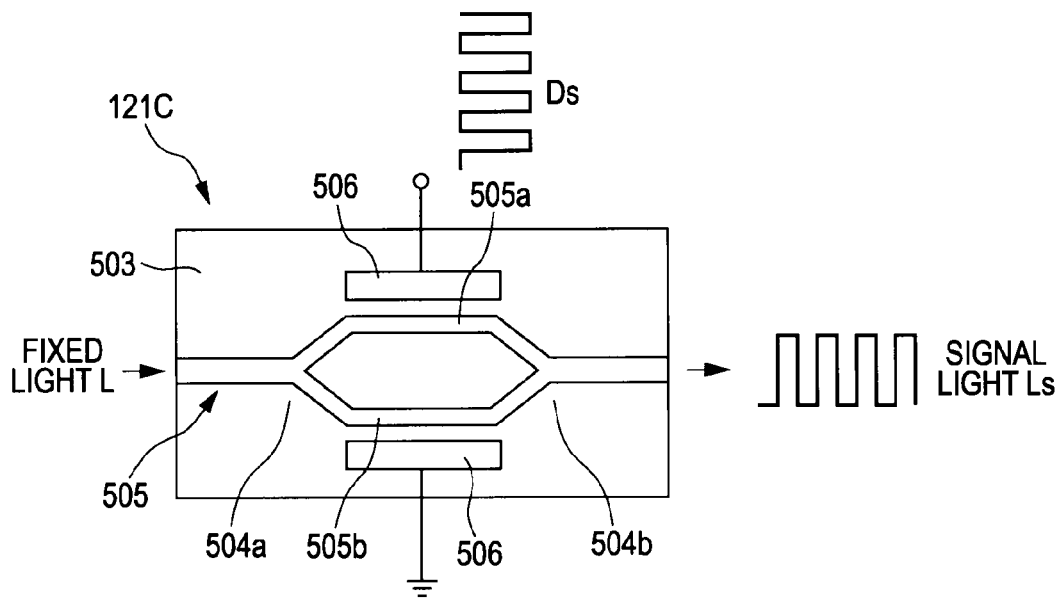
FIG. 7 is a configuration diagram illustrating another example of an optical communication unit of a solid-state imaging device.

FIG. 7 is a configuration diagram illustrating another example of the optical communication unit of the solid-state imaging device. The optical communication unit 12A of the solid-state imaging device 1A includes a Mach-Zehnder-type optical modulator 121C as another example of the external-modulating optical modulator. The Mach-Zehnder-type optical modulator 121C takes advantage of an electro-optical effect (Pockels effect) wherein the refractive index is changed by voltage being applied. With an optical modulator using an electro-optical effect, the phase of light can be modulated by applied voltage.

The Mach-Zehnder-type optical modulator 121C takes advantage of optical phase difference caused due to an electro-optical effect to generate optical path length difference with two waveguides making up a Mach-Zehnder interferometer, thereby interfering in light to realize on and off of the light.

The Mach-Zehnder-type optical modulator 121C includes a substrate 503 of a ferroelectric crystal such as lithium niobate (LiNbO$_3$) or the like, and an optical waveguide 505 to be branched/coupled into/from a first waveguide 505a and a second waveguide 505b by a branching portion 504a and a coupling portion 504b. Also, the Mach-Zehnder-type optical modulator 121C includes an electrode 506 to which voltage is applied. Note that the Mach-Zehnder-type optical modulator 121C may be configured of a semiconductor material such as GaAs (gallium arsenide), InP (indium phosphorus), or the like. The Mach-Zehnder-type optical modulator 121C made up of a semiconductor material is created above the InP substrate by a semiconductor process, and reduction in size can be realized as compared to the Mach-Zehnder-type optical modulator made up of LiNbO$_3$.

With the Mach-Zehnder-type optical modulator 121C, upon voltage V1 being applied such that the phase of light that passes through the first waveguide 505a and the second waveguide 505b is shifted by π, the light branched at the branching portion 504a is multiplexed at the coupling portion 504b by the phase thereof being shifted by π. The light multiplexed by the phase thereof being shifted by π is canceled out mutually by interference, and the output thereof becomes zero.

On the other hand, upon voltage V0 being applied such that the phase of light that passes through the first waveguide 505a and the second waveguide 505*b* is not shifted, the light branched at the branching portion 504*a* is multiplexed with the same phase at the coupling portion 504*b*. The light multiplexed with the same phase is intensified by interference, and the output thereof becomes 1.

Thus, with the Mach-Zehnder-type optical modulator 121C, on/off control of light is realized by applying voltage such that the phase of the light is shifted by $\pi$.

With the solid-state imaging device 1A, modulation of light is realized by applying the voltage corresponding to the electric signal output from the A/D conversion unit 11A to the Mach-Zehnder-type optical modulator 121C. Therefore, the optical communication unit 12A of the solid-state imaging device 1A is configured such that voltage due to the electric signal converted into a digital signal at the A/D conversion unit 11A and output is applied to the electrode 506 of the Mach-Zehnder-type optical modulator 121C.

Thus, with the optical communication unit 12A of the solid-state imaging device 1A, fixed light L input externally is modulated based on an electric signal Ds read out from the pixel portion 10A and digitized, and is output as signal light Ls.

Figure 8:
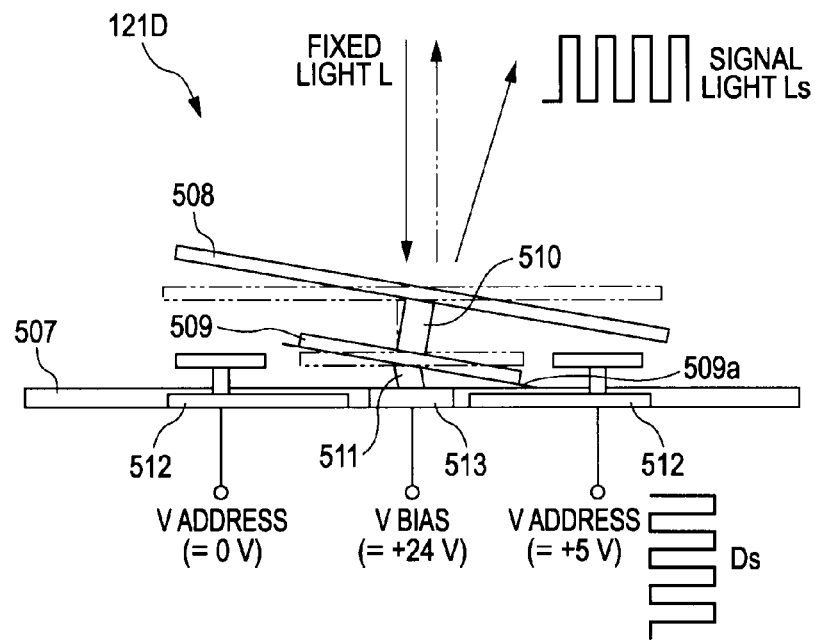
FIG. 8 is a configuration diagram illustrating another example of an optical communication unit of a solid-state imaging device.

FIG. 8 is a configuration diagram illustrating another example of the optical communication unit of the solid-state imaging device. The optical communication unit 12A of the solid-state imaging device 1A includes a mirror unit 121D as an optical modulating unit. The mirror unit 121D is a micromirror device (DMD; Digital Micromirror Device) formed using the MEMS (Micro Electro Mechanical Systems).

The mirror unit 121D includes a reflecting mirror 508, a yoke 509 to be attached to the reflecting mirror 508, and a mirror support host 510 which fixes the reflecting mirror 508 to the yoke 509, on a substrate 507 formed of silicon (Si), for example. The reflecting mirror 508 and the yoke 509 are supported by the substrate 507 using a hinge 511. An impingement plate 509*a* is formed on the tip of the yoke 509. The hinge 511 has elasticity to be deformed or restored. An address electrode 512 is formed on the substrate 507. The address electrode 512 faces the yoke 509 and the reflecting mirror 508. The yoke 509 and the reflecting mirror 508 are mechanically or electrically connected to a bias reset bus 513.

When the mirror unit 121D applies bias voltage and voltage to the address electrode 512, electrostatic attraction affects between the reflecting mirror 508 and the address electrode 512, and between the yoke 509 and the address electrode 512, thereby generating electrostatic torque. Thus, the reflecting mirror 508 and the yoke 509 rotate until the impingement plate 509*a* lands and stops, thereby inclining the reflecting mirror 508. In the case that bias voltage is not applied, the reflecting mirror 508 and the yoke 509 are stabilized in horizontal positions according to the restoring force of the hinge 511.

Thus, with the mirror unit 121D, the direction where light input to the reflecting mirror 508 is reflected is changed depending on whether or not voltage is applied, on the optical reception side the optical reception amount is changed according to the angle of the reflecting mirror 508, whereby on/off control of light is realized.

With the solid-state imaging device 1A, the voltage corresponding to the electric signal output from the A/D conversion unit 11A is applied to the mirror unit 121D, thereby realizing modulation of light. Therefore, the optical communication unit 12A of the solid-state imaging device 1A is configured such that the voltage due to the electric signal converted into a digital signal at the A/D conversion unit 11A and output is applied to the mirror unit 121D.

Thus, with the optical communication unit 12A of the solid-state imaging device 1A, fixed light L input externally is modulated based on an electric signal Ds read out from the pixel portion 10A and digitized, and is output as signal light Ls.

Internal Layout Example of Components Making Up Optical Communication Unit of Solid-state Imaging Device According to First Embodiment With the solid-state imaging device according to the first embodiment, the optical communication unit includes as an optical output unit a self-emitting light emitting element or external-modulating optical modulator, and a driving unit of the light emitting element or optical modulator, and so forth. Next, a preferred layout example of the light emitting element or optical modulator, and the driving unit will be described.

(1) Layout Example Including Single Self-emitting Optical Output Unit

Figure 9:
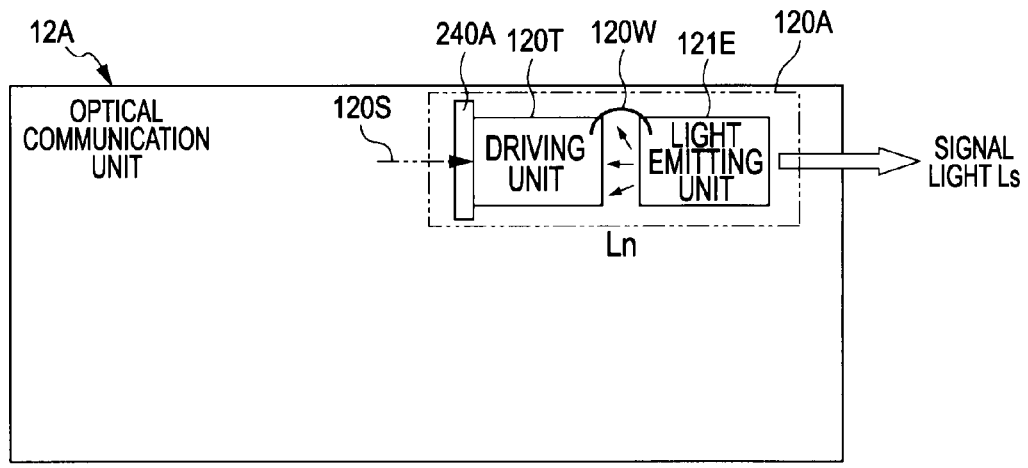
FIG. 9 is a schematic plan view illustrating a first layout example of components making up an optical communication unit.
Figure 10:
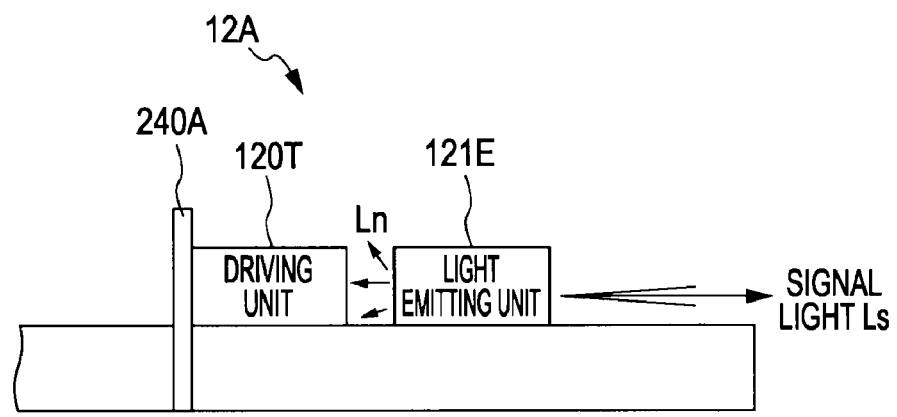
FIG. 10 is a schematic side view illustrating the first layout example of the components making up the optical communication unit.

FIGS. 9 and 10 illustrate a first layout example of components making up an optical communication unit, wherein FIG. 9 is a schematic plan view illustrating the first layout example of the components making up the optical communication unit, and FIG. 10 is a schematic side view illustrating the first layout example of the components making up the optical communication unit.

With the example shown in FIGS. 9 and 10, the optical communication unit 12A of the solid-state imaging device 1A has a configuration including a single self-emitting light emitting element, and has a configuration including a light emitting unit 121E made up of an edge-emitting semiconductor laser as an optical output unit 120A.

With the light emitting unit 121E, one side edge face is a light emitting face, where the signal light Ls is output in the direction indicated with an arrow. Note that with the light emitting unit 121E, leakage light Ln of certain quantity is output in the direction indicated with arrows from the side edge face of the opposite side of the light emitting face.

The optical output unit 120A includes a driving unit 120T which drives the light emitting unit 121E. The driving unit 120T is disposed aside of the light emitting unit 121E on the side facing the side edge face where the leakage light Ln is output, in series with the output direction of the signal light Ls of the light emitting unit 121E. The electric signal converted into a digital signal is supplied to the driving unit 120T from the opposite side of the light emitting unit 121E in series with the driving unit 120T by way of a driving signal line 120S, for example, in the direction indicated with an arrow. Note that, with the optical output unit 120A, in the case of a configuration wherein the light emitting unit 121E and the driving unit 120T are formed as independent components, between the driving unit 120T and the light emitting unit 121E is connected with a bonding wire 120W, where the electric signal is supplied. Also, with the optical output unit 120A, in the case of a configuration wherein the light emitting unit 121E and the driving unit 120T are integrated, between the driving unit 120T and the light emitting unit 121E is connected with a wiring layer made up of aluminum, tungsten, or the like within a semiconductor, where the electric signal is supplied.

The optical communication unit 12A includes a light shielding portion 240A which shields the leakage light Ln output from the light emitting unit 121E. The light shielding portion 240A is configured of a material which does not transmit at least light having an oscillation wavelength at the light emitting unit 121E, and is disposed facing the side edge face where the leakage light Ln is output, as to the light emitting unit 121E.

With the present example, the driving unit 120T is disposed in series with the light emitting unit 121E, and accordingly, the light shielding portion 240A is disposed on the opposite side of the light emitting unit 121E as to the driving unit 120T disposed in series with the light emitting unit 121E. Thus, the leakage light Ln output from the light emitting unit 121E can be shielded by the light shielding portion 240A.

With the example shown in FIGS. 9 and 10, the driving unit 120T is disposed in series with the direction where light is output at the light emitting unit 121E. Thus, in the case that the optical output units 120A are arrayed, the light emitting unit 121E is disposed in parallel with the direction where the light emitting unit 121E and the driving unit 120T are disposed in series, and accordingly, no driving unit 120T is disposed between the adjacent light emitting units 121E, and reduction in size can be realized.

(2) Another Layout Example Including Single Self-Emitting Optical Output Unit

Figure 11:
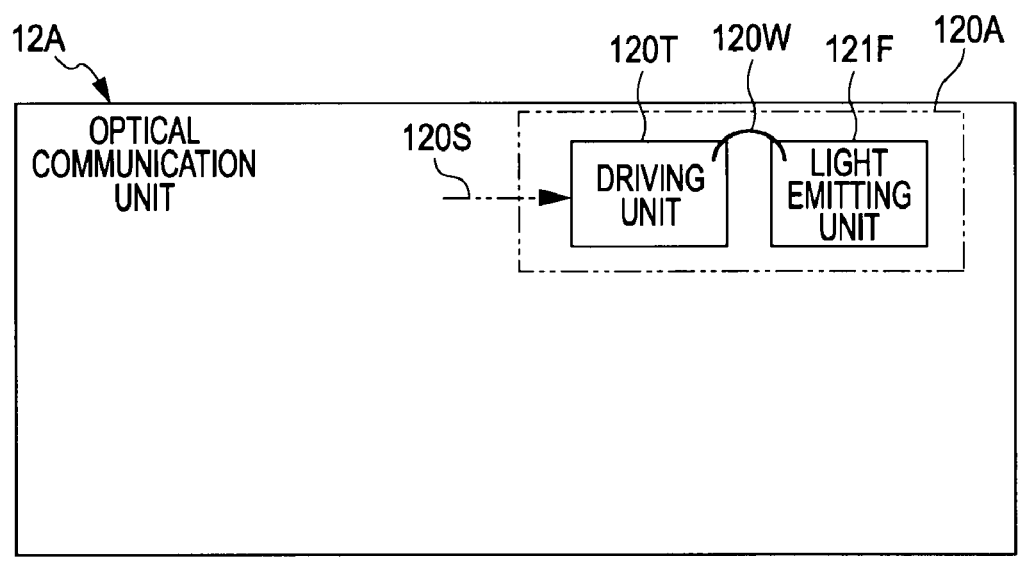
FIG. 11 is a schematic plan view illustrating a second layout example of components making up an optical communication unit.
Figure 12:
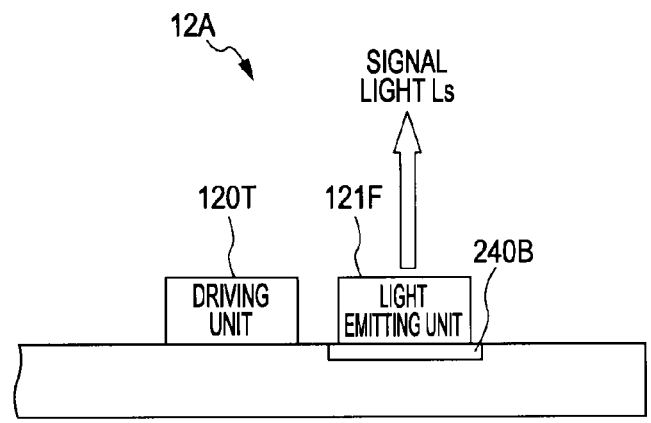
FIG. 12 is a schematic side view illustrating the second layout example of the components making up the optical communication unit.

FIGS. 11 and 12 illustrate a second layout example of components making up an optical communication unit, wherein FIG. 11 is a schematic plan view illustrating the second layout example of the components making up the optical communication unit, and FIG. 12 is a schematic side view illustrating the second layout example of the components making up the optical communication unit.

With the example shown in FIGS. 11 and 12, the optical communication unit 12A of the solid-state imaging device 1A has a configuration including a single self-emitting light emitting element, and has a configuration including a light emitting unit 121F made up of a surface-emitting semiconductor laser (VCSEL) such as shown in FIG. 4 as an optical output unit 120A.

With the light emitting unit 121F, the upper face is a light emitting face, where the signal light Ls is output in the direction indicated with an arrow. Note that with the light emitting unit 121F, leakage light of certain quantity is output from the lower face of the opposite side of the light emitting face.

The optical output unit 120A includes a driving unit 120T which drives the light emitting unit 121F. The electric signal converted into a digital signal is supplied to the driving unit 120T from the opposite side of the light emitting unit 121F in series with the driving unit 120T by way of a driving signal line 120S, for example, in the direction indicated with an arrow. Note that, with the optical output unit 120A, in the case of a configuration wherein the light emitting unit 121F and the driving unit 120T are formed as independent components, between the driving unit 120T and the light emitting unit 121F is connected with a bonding wire 120W, where the electric signal is supplied. Also, with the optical output unit 120A, in the case of a configuration wherein the light emitting unit 121F and the driving unit 120T are integrated, between the driving unit 120T and the light emitting unit 121F is connected with a wiring layer made up of aluminum, tungsten, or the like within a semiconductor, where the electric signal is supplied.

The optical communication unit 12A includes a light shielding portion 240B which shields the leakage light Ln output from the light emitting unit 121F. The light shielding portion 240B is configured of a material which does not transmit at least light having an oscillation wavelength at the light emitting unit 121F, and is disposed in the lower face where the leakage light is output, as to the light emitting unit 121F. Thus, the leakage light output from the light emitting unit 121F can be shielded by the light shielding portion 240B.

With the example shown in FIGS. 11 and 12 as well, the driving unit 120T is disposed in series with the light emitting unit 121F. Thus, in the case that the optical output units 120A are arrayed, the light emitting unit 121F is disposed in parallel with the direction where the light emitting unit 121F and the driving unit 120T are disposed in series, and accordingly, no driving unit 120T is disposed between the adjacent light emitting units 121F, and reduction in size can be realized.

(3) Layout Example in which Self-Emitting Optical Output Units are Arrayed

Figure 13:
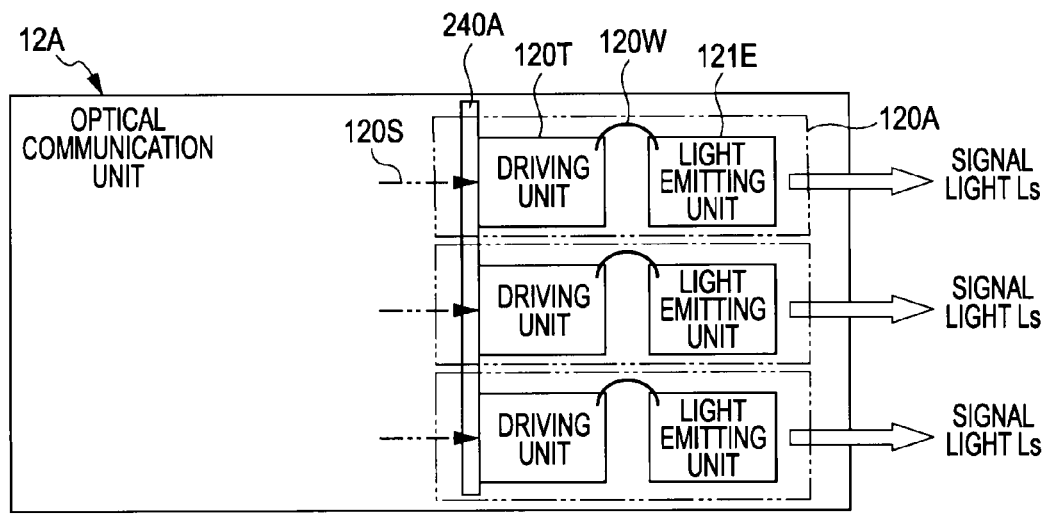
FIG. 13 is a schematic plan view illustrating a third layout example of components making up an optical communication unit.

FIG. 13 is a schematic plan view illustrating a third layout example of components making up an optical communication unit. The example shown in FIG. 13 has a configuration wherein a light emitting unit 121E configured of an edge-emitting semiconductor laser is included as a light emitting element, and optical output units 120A including the light emitting unit 121E and the driving unit 120T are arrayed.

As described above, the driving unit 120T is disposed in series with the direction where light is output at the light emitting unit 121E. In the case that the optical output units 120A are arrayed, the light emitting unit 121E is disposed in parallel with the direction where the light emitting unit 121E and the driving unit 120T are disposed in series.

The optical communication unit 12A includes a light shielding portion 240A which shields the leakage light Ln output from the light emitting unit 121E. The light shielding portion 240A is configured of a material which does not transmit at least light having an oscillation wavelength at the light emitting unit 121E, and is disposed facing the side edge face where the leakage light Ln is output, as to the light emitting unit 121E.

With the present example, the driving unit 120T is disposed in series with the light emitting unit 121E, and accordingly, the light shielding portion 240A is disposed on the opposite side of the light emitting unit 121E as to the driving unit 120T disposed in series with the light emitting unit 121E. Thus, the leakage light Ln output from the light emitting unit 121E can be shielded by the light shielding portion 240A.

Thus, the multiple light emitting units 121E and the driving units 120T are adjacently integrated respectively, and no driving unit 120T is disposed between the adjacent light emitting units 121E, whereby reduction in size of the optical communication unit 12A can be realized. Note that, with the configuration in FIG. 13, the same advantage is obtained even in the event that the edge-emitting semiconductor laser is replaced with a surface-emitting semiconductor laser.

With the configuration in FIG. 13, the optical communication unit 12A is configured such that a plurality of signal light Ls are output in parallel. The pitch of the signal light Ls can be determined without being restricted to the positions of the driving units 120T, and accordingly, flexibility in arrayed light pitch increases.

(4) Layout Example Including Single External-Modulating Optical Output Unit

Figure 14:
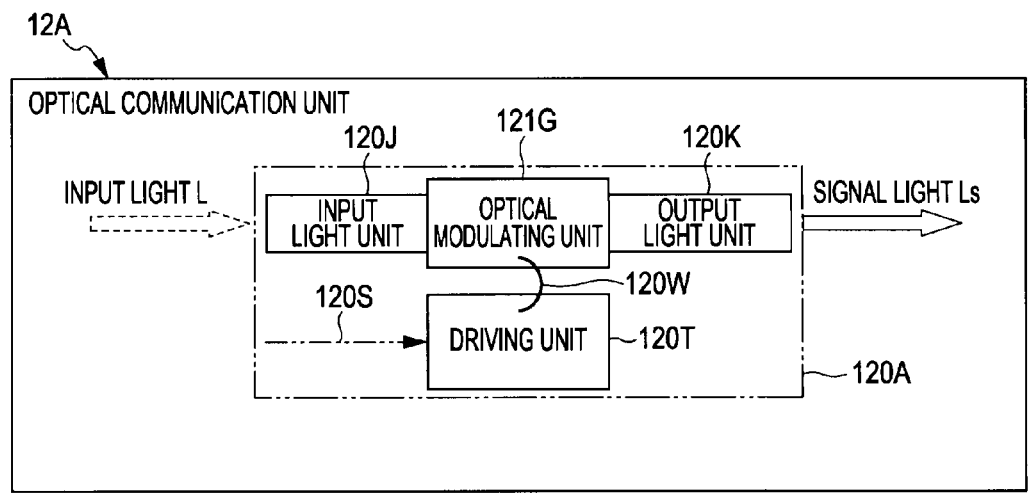
FIG. 14 is a schematic plan view illustrating a fourth layout example of components making up an optical communication unit.

FIG. 14 is a schematic plan view illustrating a fourth layout example of components making up an optical communication unit. With the example shown in FIG. 14, the optical communication unit 12A of the solid-state imaging device 1A has a configuration including a single external-modulating optical modulating unit 121G as an optical output unit 120A, and the optical modulating unit 121G is configured of an electroabsorption optical modulator 121B described in FIG. 5, or a Mach-Zehnder-type optical modulator 121C described in FIG. 17. Alternatively, the optical modulating unit 121G may be configured of liquid crystal or the like which controls optical transmittance.

With the optical output unit 120A, one edge face side of the optical modulating unit 121G becomes the input edge of light, and the other edge portion of the opposite side becomes the output edge of light, and an input light unit 120J configured of an optical waveguide or the like is connected to the input edge. Also, an output light unit 120K configured of an optical waveguide or the like is connected to the output edge.

With the optical modulating unit 121G, external fixed light L is input to the input light unit 120J from the direction indicated with an arrow. Also, modulated signal light Ls is output to the opposite side of the input light L, i.e., the direction indicated with an arrow from the output light unit 120K.

The optical communication unit 12A includes a driving unit 120T which drives the optical modulating unit 121G. The driving unit 120T is disposed aside of the optical modulating unit 121G, at a position orthogonal to the light L to be input to the optical modulating unit 121G, and the signal light Ls to be output therefrom. Thus, a configuration is realized wherein the light L to be input to the optical modulating unit 121G, and the signal light Ls to be output therefrom are not interrupted by the driving unit 120T. The electric signal converted into a digital signal is supplied to the driving unit 120T by way of a driving signal line 120S, for example, in the direction indicated with an arrow. Note that, with the optical output unit 120A, in the case of a configuration wherein the optical modulating unit 121G and the driving unit 120T are formed as independent components, between the driving unit 120T and the optical modulating unit 121G is connected with a bonding wire 120W, where the electric signal is supplied. Also, with the optical output unit 120A, in the case of a configuration wherein the optical modulating unit 121G and the driving unit 120T are integrated, between the driving unit 120T and the optical modulating unit 121G is connected with a wiring layer made up of aluminum, tungsten, or the like within a semiconductor, where the electric signal is supplied.

Figure 15:
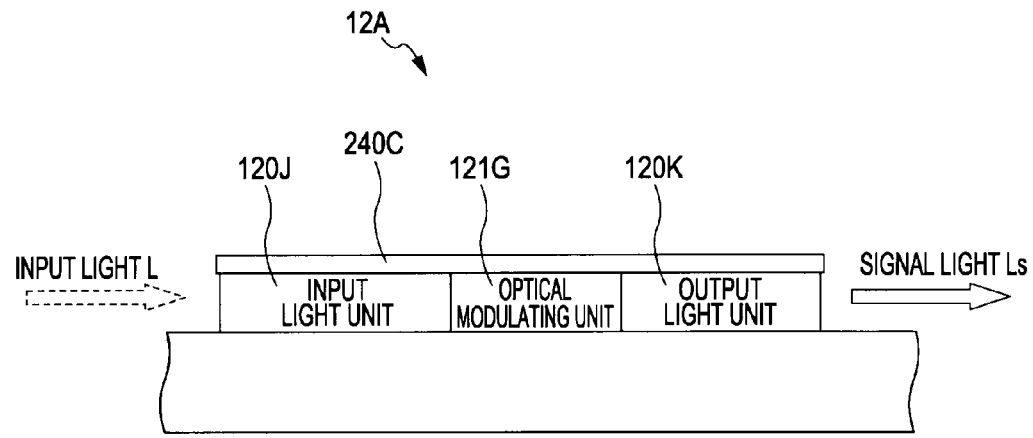
FIG. 15 is a schematic side view illustrating a fifth layout example of components making up an optical communication unit.
Figure 16:
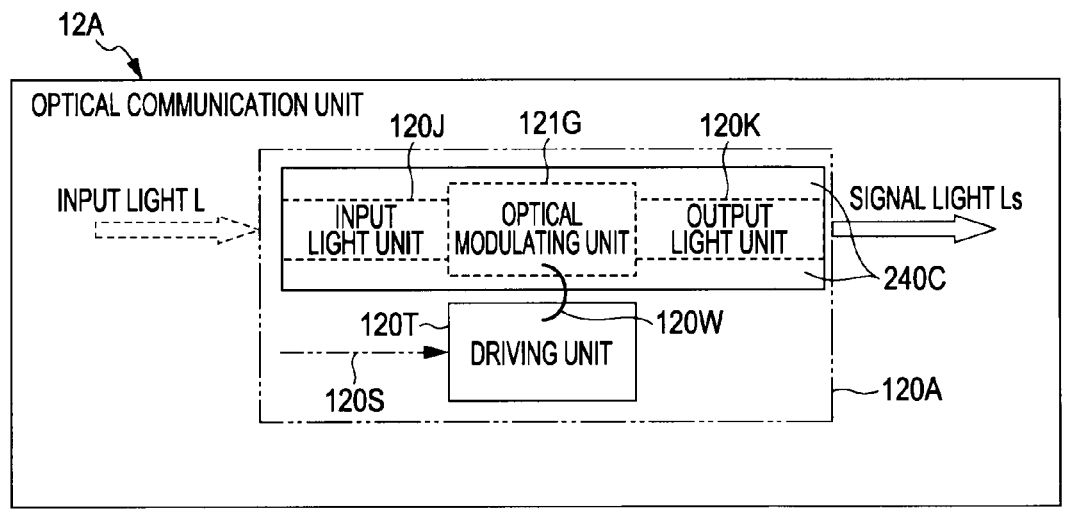
FIG. 16 is a schematic plan view illustrating the fifth layout example of the components making up the optical communication unit.

(5) Another Layout Example Including Single External-modulating Optical Output Unit FIGS. 15 and 16 illustrate a fifth layout example of components making up an optical communication unit, wherein FIG. 15 is a schematic side view illustrating the fifth layout example of the components making up the optical communication unit, and FIG. 16 is a schematic plan view illustrating the fifth layout example of the components making up the optical communication unit.

With the example shown in FIGS. 15 and 16, the optical communication unit 12A of the solid-state imaging device 1A has, as described above, a configuration including a single external-modulating optical modulating unit 121G, and includes an input light unit 120J, an output light unit 120K, and a light shielding portion 240C, which are connected to the optical modulating unit 121G.

With the optical modulating unit 121G, external light L is input to the input light unit 120J from the horizontal direction. Also, the modulated signal light Ls is output in the horizontal direction from the output light unit 120K. The light shielding portion 240C is configured so as to cover the whole of the side faces and the upper faces of the input light unit 120J and the output light unit 120K except for the edge faces where an input portion of light from the outside of the input light unit 120J, and an output portion of light to the outside of the output light unit 120K are formed.

Note that the whole of the lower faces of the input light unit 120J and the output light unit 120K may also be covered so as to prevent leakage of light to the substrate making up the optical communication unit 12A. Further, in order to prevent leakage of light from connection portions with the input light unit 120J, output light unit 120K, and optical modulating unit 121G, the input light unit 120J and output light unit 120K including the optical modulating unit 121G may be covered with the light shielding portion 240C.

Thus, the light L to be input to the input light unit 120J and wave-guided to the optical modulating unit 121G can be prevented from leaking from the input light unit 120J. Also, the signal light Ls to be output from the optical modulating unit 121G and wave-guided to the output light unit 120K can be prevented from leaking from other than the output portion of the output light unit 120K.

Figure 17:
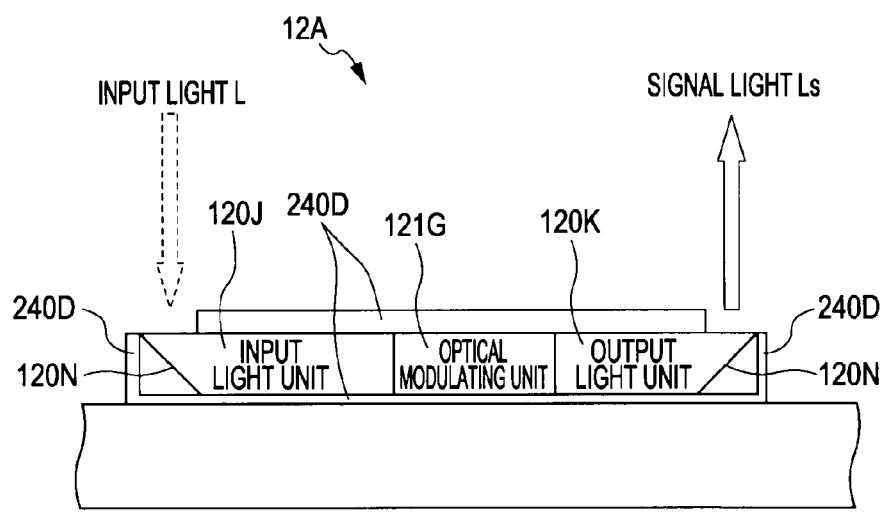
FIG. 17 is a schematic side view illustrating a sixth layout example of components making up an optical communication unit.
Figure 18:
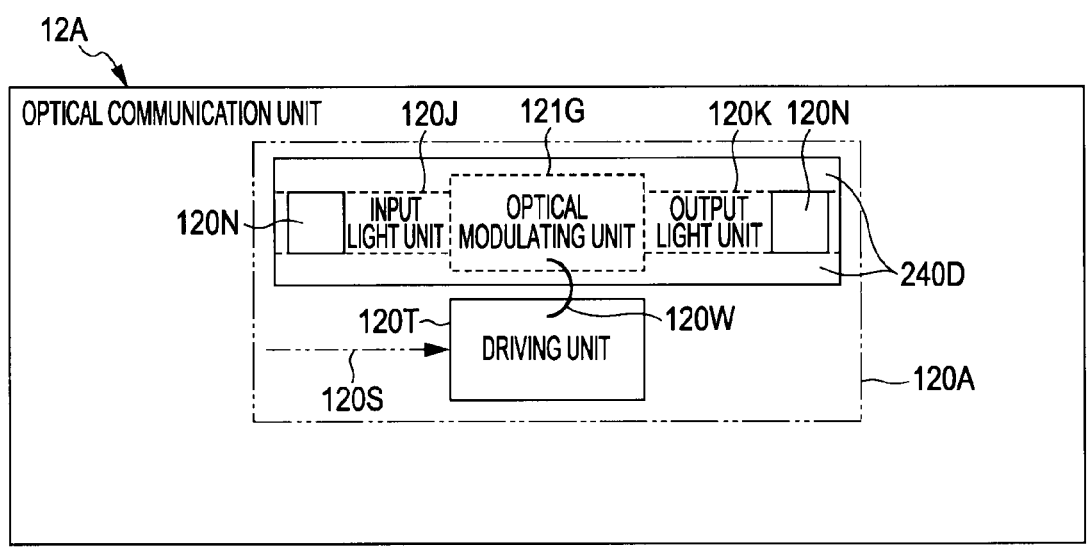
FIG. 18 is a schematic plan view illustrating the sixth layout example of components making up an optical communication unit.

(6) Another Layout Example Including Single External-Modulating Optical Output Unit FIGS. 17 and 18 illustrate a sixth layout example of components making up an optical communication unit, wherein FIG. 17 is a schematic side view illustrating the sixth layout example of the components making up the optical communication unit, and FIG. 18 is a schematic plan view illustrating the sixth layout example of the components making up the optical communication unit.

With the example shown in FIGS. 17 and 18, the optical communication unit 12A of the solid-state imaging device 1A has, as described above, a configuration including a single external-modulating optical modulating unit 121G, and includes an input light unit 120J, an output light unit 120K, and a light shielding portion 240C, which are connected to the optical modulating unit 121G.

With the input light unit 120J, a reflecting face 120N of 45 degrees is formed in the input portion of external light, and the light L from the outside is input to the input light unit 120J from the vertical direction. With the output light unit 120K as well, a reflecting face 120N of 45 degrees is formed in the input portion of external light, and the modulated signal light Ls is output from the output light unit 120K to the vertical direction.

The light shielding portion 240D is configured so as to cover the whole of the edge faces, side faces, and lower faces of the input light unit 120J and the output light unit 120K, and the portion of the upper face except for the portion of the upper face where the input light unit 120J for input of external light and the output portion of light to the outside from the output light unit 120K are formed.

Note that, in order to prevent leakage of light from the connected portions between the input light unit 120J and the output light unit 120K, and the optical modulating unit 121G, the input light unit 120J and the output light unit 120K including the optical modulating unit 121G may be covered with the light shielding portion 240D.

Thus, the light L to be input to the input light unit 120J and wave-guided to the optical modulating unit 121G can be prevented from leaking from the input light unit 120J due to reflection or the like. Also, the signal light Ls to be output from the optical modulating unit 121G and wave-guided to the output light unit 120K can be prevented from leaking from other than the output portion of the output light unit 120K due to reflection or the like.

(7) Layout Example in which External-Modulating Optical Output Unit are Arrayed

Figure 19:
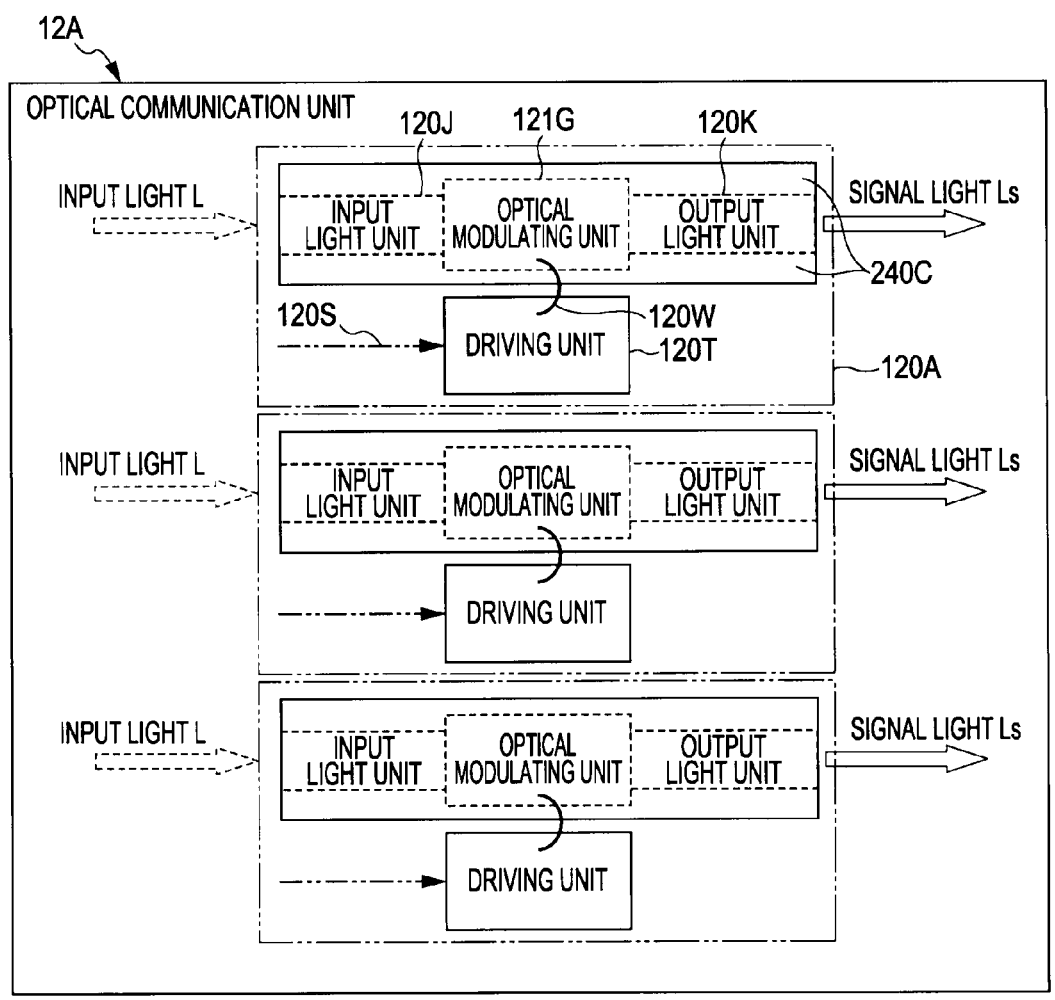
FIG. 19 is a schematic plan view illustrating a seventh layout example of components making up an optical communication unit.

FIG. 19 is a schematic plan view illustrating a seventh layout example of components making up an optical communication unit. With the example shown in FIG. 19, the optical communication unit 12A of the solid-state imaging device 1A includes an external-modulating optical modulating unit 121G as described above, and has a configuration wherein optical output units 120A including the optical modulating unit 121G, and the driving unit 120T are arrayed.

With the optical modulating unit 121G, as described above, the input light unit 120J is connected to one of facing edge faces, and the output light unit 120K is connected to the other thereof, and accordingly, the driving unit 120T is disposed to the side portion of the optical modulating unit 121G. In the case that the optical output units 120A are arrayed, a layout is employed wherein the optical modulating units 121G are arrayed in parallel in the direction orthogonal to the light L input to the optical modulating unit 121G and the signal light Ls output from the optical modulating unit 1216, and the optical modulating units 121G and the driving units 120T are disposed alternately.

Figure 20:
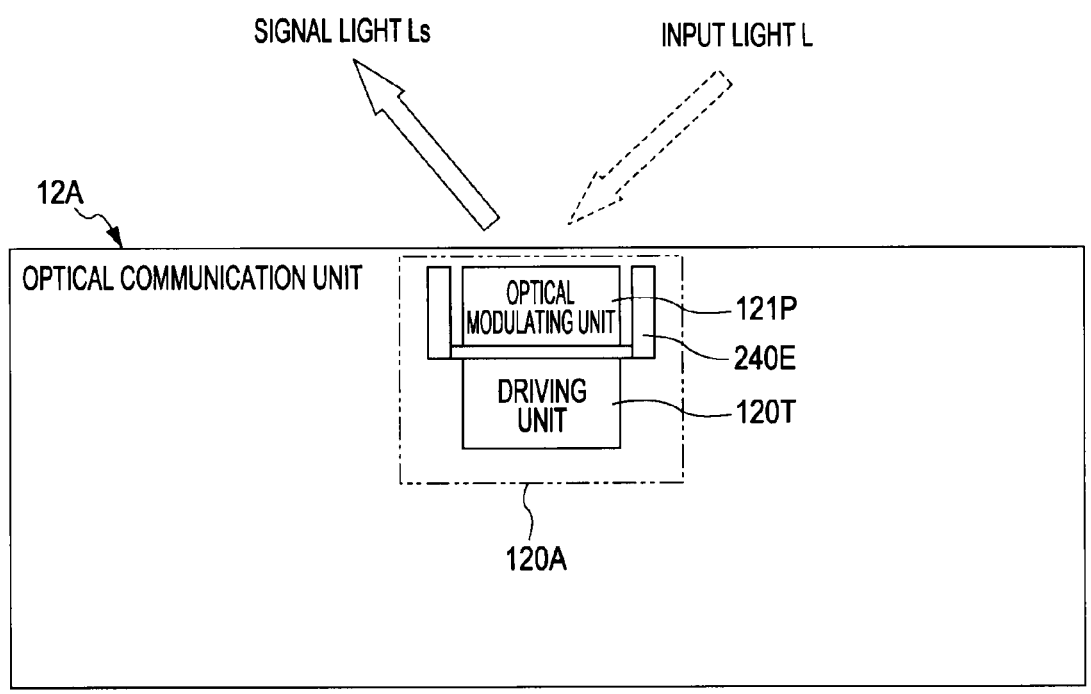
FIG. 20 is a schematic plan view illustrating an eighth layout example of components making up an optical communication unit.
Figure 21A:
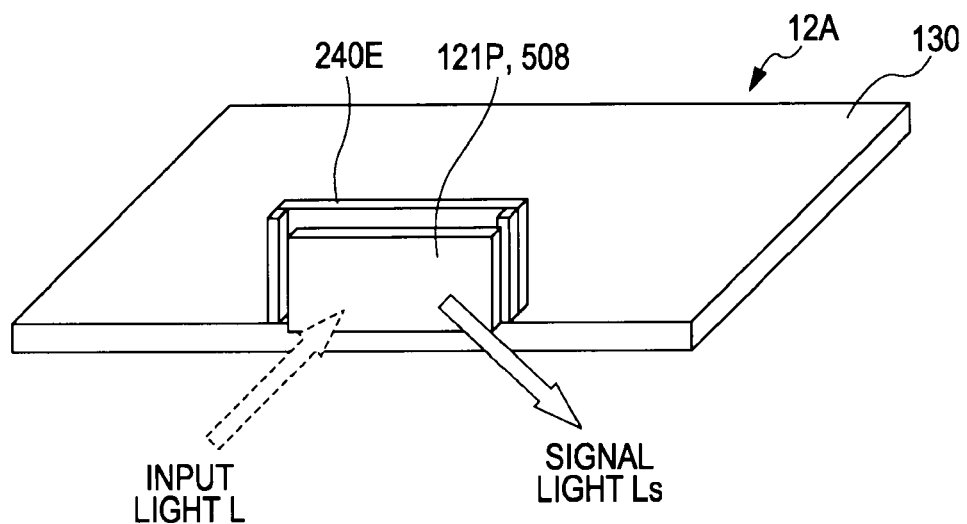
FIGS. 21A and 21B are schematic perspective views illustrating the eighth layout example of the components making up the optical communication unit.
Figure 21B:
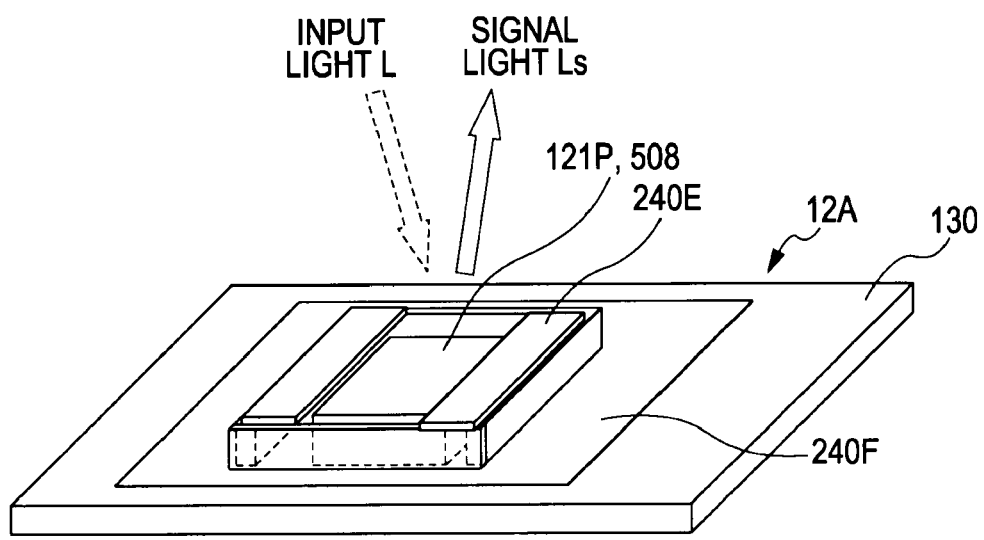

(8) Another Layout Example Including Single External-Modulating Optical Output Unit FIGS. 20, 21A, and 21B illustrate an eighth layout example of components making up an optical communication unit, wherein FIG. 20 is a schematic side view illustrating the eighth layout example of the components making up the optical communication unit, and FIGS. 21A and 21B are schematic perspective views illustrating the eighth layout example of the components making up the optical communication unit.

With the example shown in FIGS. 20, 21A and 21B, the optical communication unit 12A of the solid-state imaging device 1A has a configuration including a single external-modulating optical modulating unit 121P. For example, the optical modulating unit 121P is configured of a mirror unit 121D which is a micromirror device described in FIG. 8.

The optical modulating unit 121P outputs the signal light Ls by switching the reflecting direction at the time of reflecting the light L from the outside. In FIG. 21A, for example, light is input/output from the horizontal direction to a substrate 130 in a mode wherein the reflecting mirror 508 described in FIG. 8 is erected in the vertical direction as to the substrate 130 making up the optical communication unit 12A. Therefore, in order to prevent the light L input to the optical modulating unit 121P, and the signal light Ls reflected and output therefrom from leaking other than a predetermined direction from the optical modulating unit 121P, a light shielding portion 240E is provided around the optical modulating unit 121P. The driving unit 120T of the optical modulating unit 121P is, for example, disposed on the rear side of the light shielding portion 240E. In FIG. 21B, for example, the reflecting mirror 508 described in FIG. 8 is level to the substrate 130, where light is input/output from the vertical direction as to the substrate 130. Therefore, in order to prevent the light L input to the optical modulating unit 121P, and the signal light Ls reflected and output therefrom from leaking other than a predetermined direction from the optical modulating unit 121P, a light shielding portion 240E is provided with predetermined height around the optical modulating unit 121P. Also, an ambient light shielding portion 240F which shields light not input to the optical modulating unit 121P is provided in the lower portion around the optical modulating unit 121P.

Figure 22:
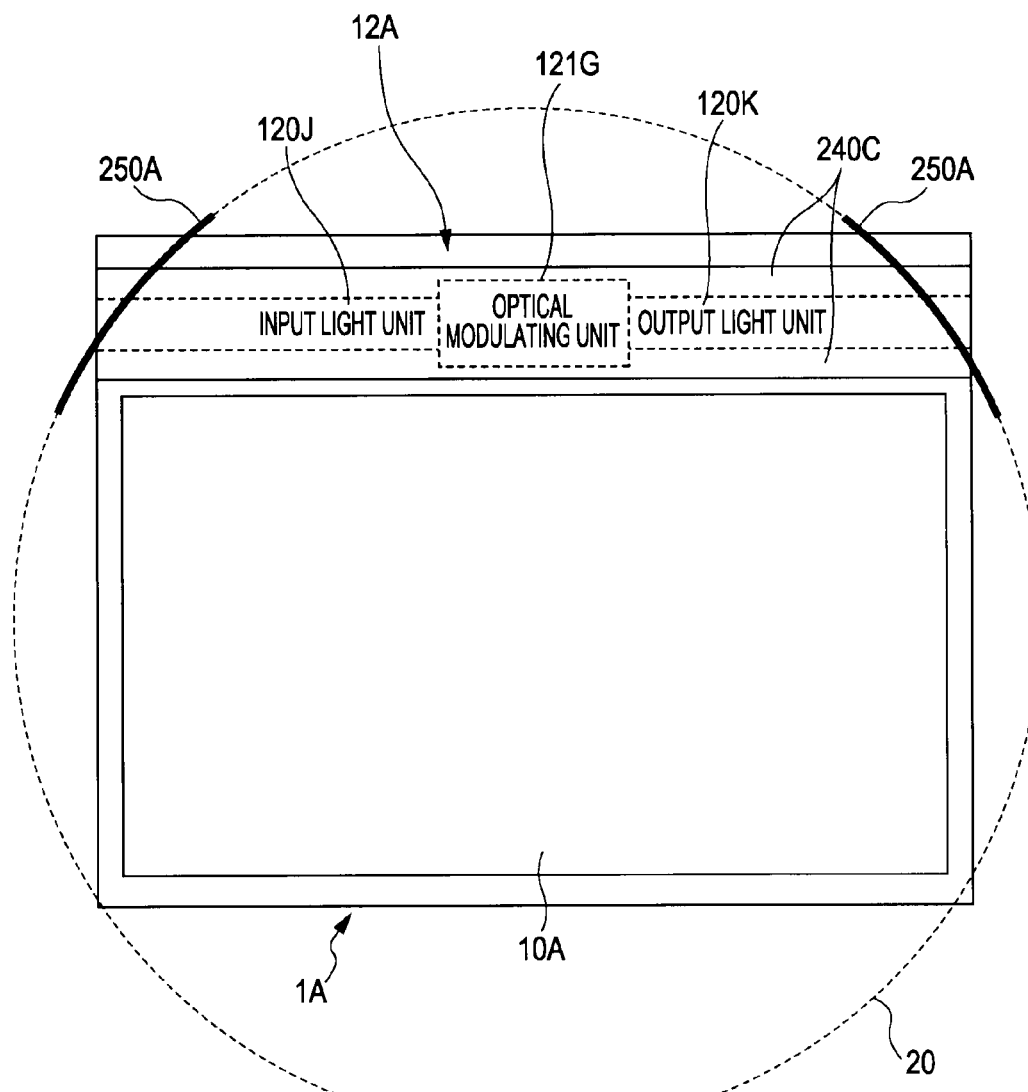
FIG. 22 is a schematic plan view illustrating a first configuration example of an optical communication unit according to relationship between a lens portion and a pixel portion.

Configuration Example of Optical Communication Unit According to Relationship of Lens and Pixel Portion FIG. 22 is a schematic plan view illustrating a first configuration example of an optical communication unit according to relationship between the lens portion and the pixel portion. With the solid-state imaging device 1A, a lens portion 20 is disposed on the front face of the pixel portion 10A, and an optical image input from the lens portion 20 is formed on the pixel portion 10A.

The example in FIG. 22 illustrates a configuration wherein the optical communication unit 12A is disposed in the inner side of the diameter of the lens portion 20. With such a configuration, light output from the optical communication unit 12A has to be prevented from leaking into the lens portion 20. Also, light input to the lens portion 20 has to be prevented from being mixing with light output from the optical communication unit 12A.

Therefore, for example, as described in FIGS. 15 and 16, the optical communication unit 12A has a configuration including an optical modulating unit 121G, and a light shielding portion 240C as to an input light unit 120J and an output light unit 120K connected to the optical modulating unit 121G. The light shielding portion 240C is configured so as to cover the whole of the side faces and the upper faces of the input light unit 120J, output light unit 120K, and optical modulating unit 121G except for the edge faces where an input portion of light from the outside of the input light unit 120J, and an output portion of light to the outside of the output light unit 120K are formed. Also, a light shielding portion 250A is provided between the input portion of light from the outside of the input light unit 120J, the output portion of light to the outside of the output light unit 120K, and the lens barrel making up the lens portion 20.

Thus, the light output from the optical communication unit 12A can be prevented from leaking into the lens portion 20 and inputting to the pixel portion 10A as stray light. Alternatively, with a configuration wherein the optical communication unit 12A is an external-modulating optical modulating unit as well, the light output from the optical communication unit 12A can be prevented from leaking into the lens portion 20 and inputting to the pixel portion 10A as stray light. Further, the light input to the lens portion 20 can be prevented from being mixed with the light output from the optical communication unit 12A to become false signal light.

Figure 23:
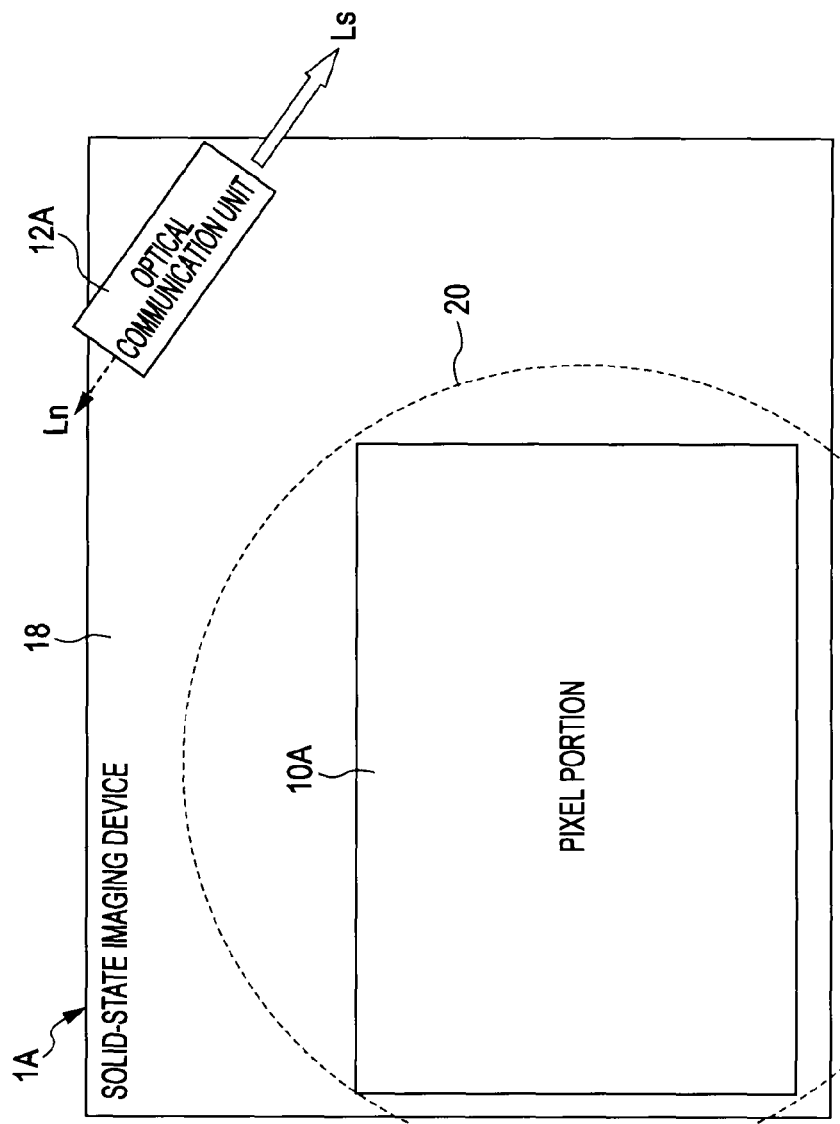
FIG. 23 is a schematic plan view illustrating a second configuration example of an optical communication unit according to relationship between the lens portion and the pixel portion.

FIG. 23 is a schematic plan view illustrating a second configuration example of an optical communication unit according to relationship between the lens portion and the pixel portion. The example in FIG. 23 illustrates a configuration wherein the optical communication unit 12A is disposed on the outside of the lens portion 20. The optical communication unit 12A is disposed in a relative position as to the lens portion 20 and the pixel portion 10A such as shown in the drawing. With the following drawings of an embodiment of the present invention, the optical communication unit 12A is disposed in a simply sufficiently distant position where there is no influence upon imaging operation.

With the edge-emitting semiconductor laser, signal light Ls is output from one edge face. On the other hand, some amount of light is also output from the edge face of the opposite side. Therefore, with the optical communication unit 12A including an edge-emitting semiconductor laser as an optical output unit, the edge face of the opposite side of the output edge of the signal light Ls is disposed inclined in a direction not facing the pixel portion 10A. Thus, leakage light Ln can be prevented from inputting to the pixel portion 10A.

Configuration Example of Light Shielding Portion According to Configuration of Optical Communication Unit With the solid-state imaging device 1A, in the case that the signal light output from the optical communication unit 12A, and the light leaked from the optical communication unit 12A are input to the pixel portion 10A in a manner diffracted around the substrate 18 or a manner propagated within the substrate 18, there is a possibility that imaging may be affected. Therefore, a light shielding portion is provided so as to prevent the light from the optical communication unit 12A from leaking into the pixel portion 10A. Also, a light shielding portion is provided so as to prevent the optical communication unit 12A from being reflected at the lens or the like and being diffracted around the pixel portion 10A. Thus, the light from the optical communication unit 12A can be prevented from being mixed with the light input to the pixel portion 10A.

Figure 24:
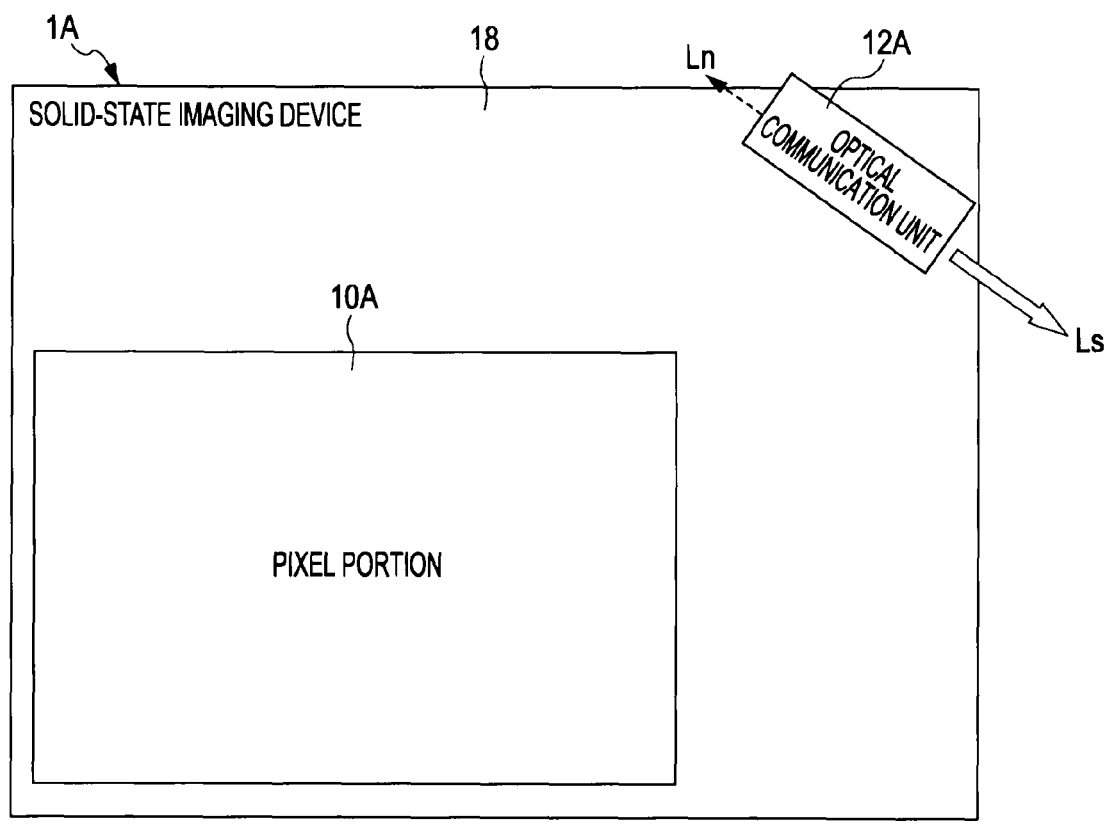
FIG. 24 is a schematic plan view of a solid-state imaging device illustrating a configuration example of a light shielding portion of a self-emitting optical communication unit disposed grouped.

(1) Configuration Example of Light Shielding Portion of Self-Emitting Optical Communication Units Disposed Grouped FIG. 24 is a schematic plan view of a solid-state imaging device illustrating a configuration example of a light shielding portion of a self-emitting optical communication unit disposed grouped. With the example in FIG. 24, light shielding is realized with a layout of the optical communication unit 12A, and accordingly, no light shielding portion is provided as another member.

With the solid-state imaging device 1A, the single optical communication unit 12A is disposed grouped in one corner portion of the peripheral portion of the substrate 18. The optical communication unit 12A includes, for example, an edge-emitting semiconductor laser as an optical output unit. With an edge-emitting semiconductor laser, the signal light Ls is output from one edge face. On the other hand, some light is also output from the edge face of the opposite side thereof. Therefore, with the optical communication unit 12A including an edge-emitting semiconductor laser, the edge face of the opposite side of the output edge of the signal light Ls is disposed inclined in a direction not facing the pixel portion 10A. Thus, leakage light Ln can be prevented from inputting to the pixel portion 10A. Note that, an example including the single optical communication unit 12A including the single optical output unit has been described in FIG. 24, but the optical communication unit in which the optical output units are arrayed, or the multiple optical communication units may be provided.

Figure 25:
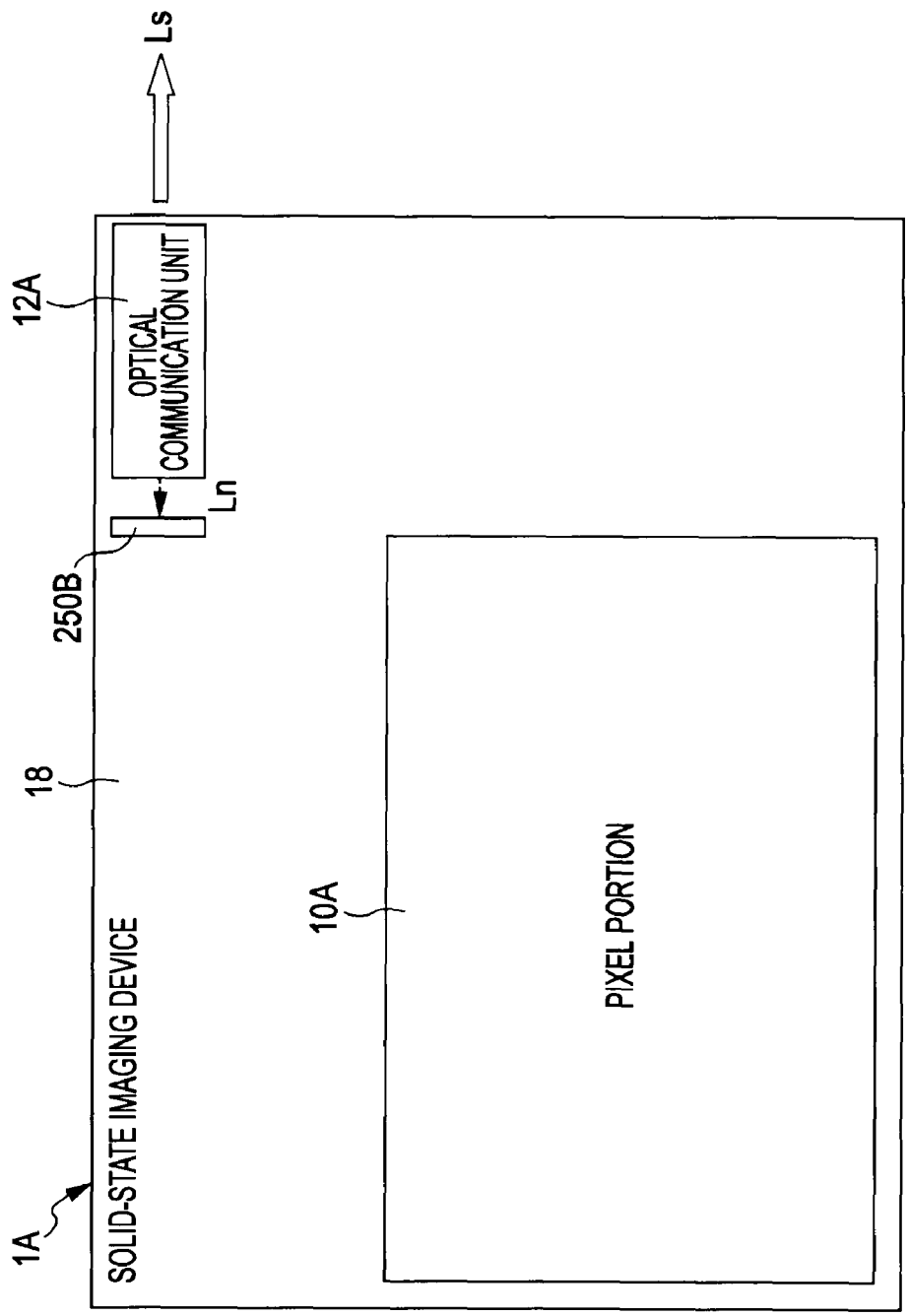
FIG. 25 is a schematic plan view of a solid-state imaging device illustrating another configuration example of a light shielding portion of a self-emitting optical communication unit disposed grouped.

(2) Another Configuration Example of Light Shielding Portion in Self-Emitting Optical Communication Unit Disposed Grouped FIG. 25 is a schematic plan view of a solid-state imaging device illustrating another configuration example of a light shielding portion of a self-emitting optical communication unit disposed grouped. With the solid-state imaging device 1A, the single optical communication unit 12A is disposed grouped at one corner in the vicinity portion of the substrate 18. The optical communication unit 12A includes, for example, an edge-emitting semiconductor laser as an optical output unit. With the example shown in FIG. 25, the optical communication unit 12A is disposed such that the direction where the signal light Ls is output is the direction generally perpendicular to the side of the substrate 18.

The solid-state imaging device 1A includes a light shielding portion 250B around the optical communication unit 12A. The light shielding portion 250B is configured of a material which does not transmit at least light having an oscillation wavelength. In the case that an edge-emitting semiconductor laser is employed as a light emitting element, the light shielding portion 250B is formed at a position facing the edge face of the opposite side of the output edge of the signal light Ls. Thus, leakage light Ln from the optical communication unit 12A can be prevented from inputting to the pixel portion 10A. Note that, an example including the single optical communication unit 12A including the single optical output unit has been described in FIG. 24, but the optical communication unit in which the optical output units are arrayed, or the optical communication units may be provided. Also, an arrangement may be made wherein the light shielding portion 250B reflects or refracts leakage light or the like to distribute this, thereby preventing this from inputting to the pixel portion 10A.

Figure 26:
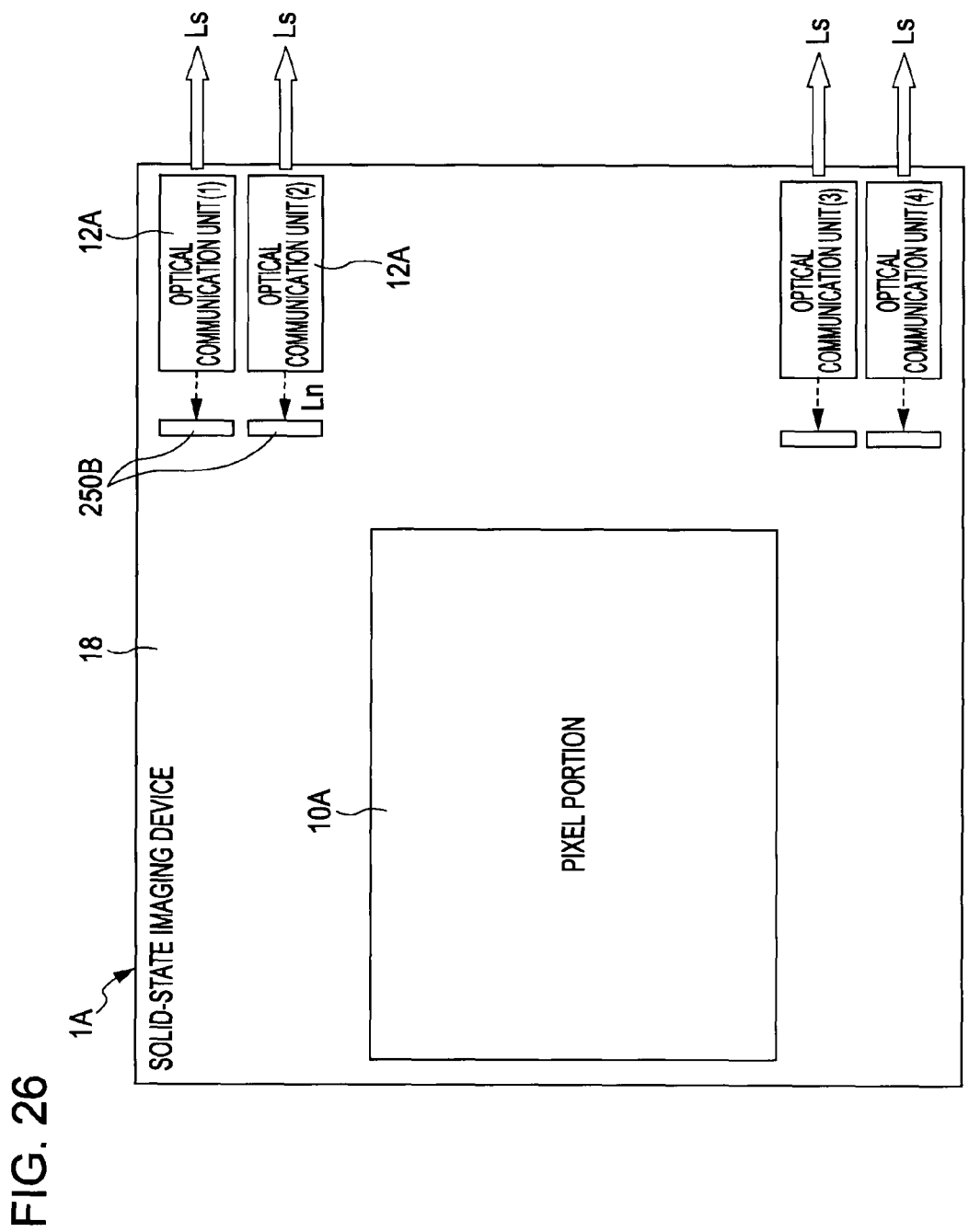
FIG. 26 is a schematic plan view of a solid-state imaging device illustrating a configuration example of a light shielding portion of a self-emitting optical communication unit disposed discretely grouped.

(3) Configuration Example of Light Shielding Portion in Self-Emitting Optical Communication Unit Disposed Discretely Grouped FIG. 26 is a schematic plan view of a solid-state imaging device illustrating a configuration example of a light shielding portion of a self-emitting optical communication unit disposed discretely grouped. With the solid-state imaging device 1A, the multiple optical communication units 12A are disposed discretely grouped at two corners in the vicinity portion of the substrate 18. The optical communication units 12A include, for example, an edge-emitting semiconductor laser as an optical output unit. With the example shown in FIG. 26, the optical communication units 12A are disposed such that the direction where the signal light Ls is output is the direction generally perpendicular to the side of the substrate 18.

The solid-state imaging device 1A includes a light shielding portion 250B around each of the optical communication units 12A. The light shielding portion 250B is configured of a material which does not transmit at least light having an oscillation wavelength. In the case that an edge-emitting semiconductor laser is employed as a light emitting element, the light shielding portion 250B is formed at a position facing the edge face of the opposite side of the output edge of the signal light Ls with each of the optical communication units 12A. Thus, with the solid-state imaging device 1A where the self-emitting optical communication units 12A are formed discretely grouped in multiple places of the substrate 18, leakage light Ln from the optical communication units 12A can be prevented from inputting to the pixel portion 10A. Note that an arrangement may be made wherein the light shielding portion 250B reflects or refracts leakage light or the like to distribute this, thereby preventing this from inputting to the pixel portion 10A.

Figure 27:
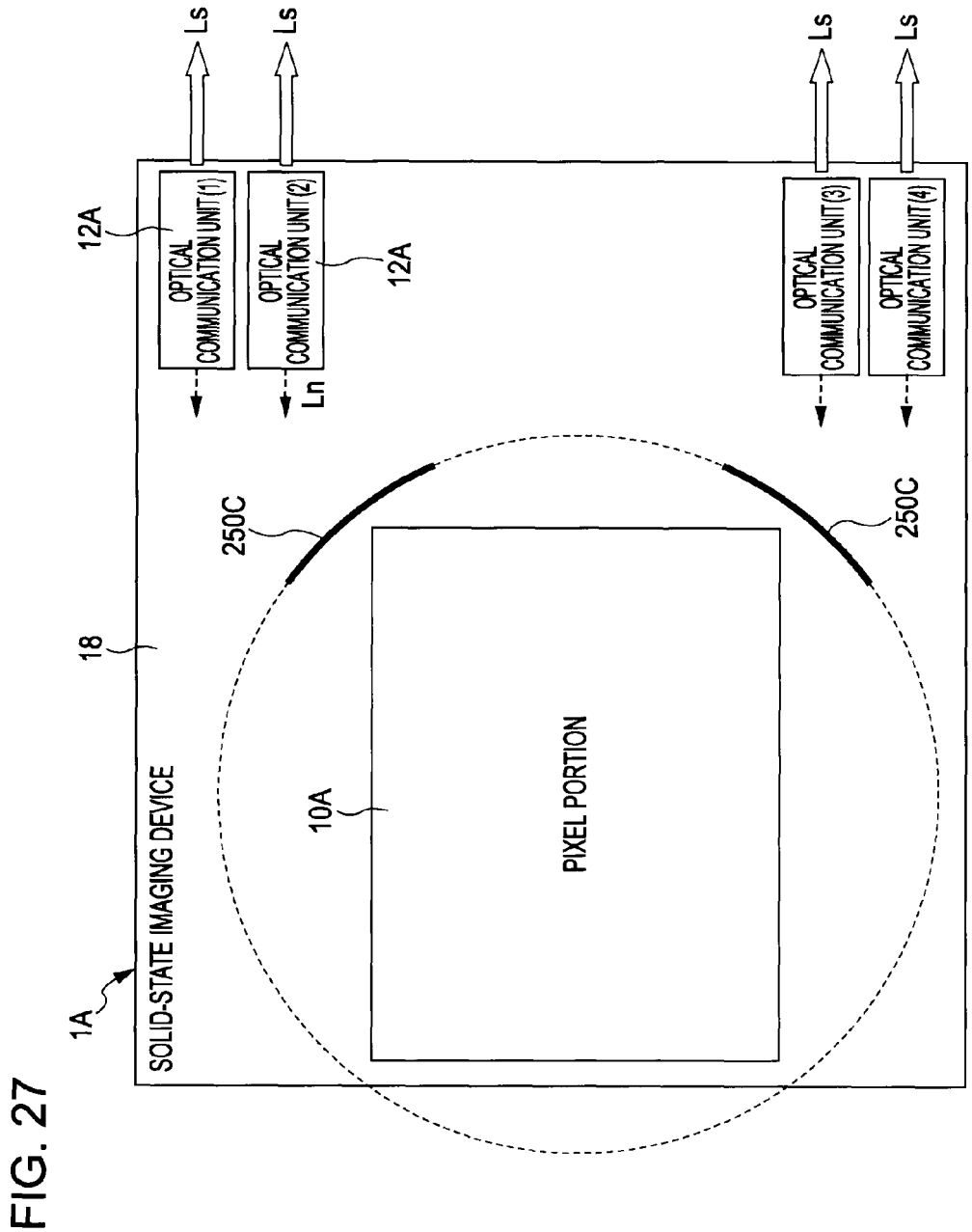
FIG. 27 is a schematic plan view of a solid-state imaging device illustrating another configuration example of a light shielding portion of a self-emitting optical communication unit disposed discretely grouped.

(4) Another Configuration Example of Light Shielding Portion in Self-Emitting Optical Communication Unit Disposed Discretely Grouped FIG. 27 is a schematic plan view of a solid-state imaging device illustrating another configuration example of a light shielding portion of a self-emitting optical communication unit disposed discretely grouped. With the solid-state imaging device 1A, the multiple optical communication units 12A are disposed discretely grouped at two corners in the vicinity portion of the substrate 18. The optical communication units 12A include, for example, an edge-emitting semiconductor laser as an optical output unit. With the example shown in FIG. 27, the optical communication units 12A are disposed such that the direction where the signal light Ls is output is the direction generally perpendicular to the side of the substrate 18.

The solid-state imaging device 1A includes a light shielding portion 250C around the pixel portion 10A. The light shielding portion 250C is configured of a material which does not transmit at least light having an oscillation wavelength. In the case that an edge-emitting semiconductor laser is employed as a light emitting element, the light shielding portion 250C is formed at a position facing the edge face of the opposite side of the output edge of the signal light Ls with each of the optical communication units 12A. Thus, with the solid-state imaging device 1A where the self-emitting optical communication units 12A are formed discretely grouped in multiple places of the substrate 18, leakage light Ln from the optical communication units 12A can be prevented from inputting to the pixel portion 10A. Note that the light shielding portion 250C may be provided to the lens portion 20. Also, an arrangement may be made wherein the light shielding portion 250C reflects or refracts leakage light or the like to distribute this, thereby preventing this from inputting to the pixel portion 10A.

Figure 28:
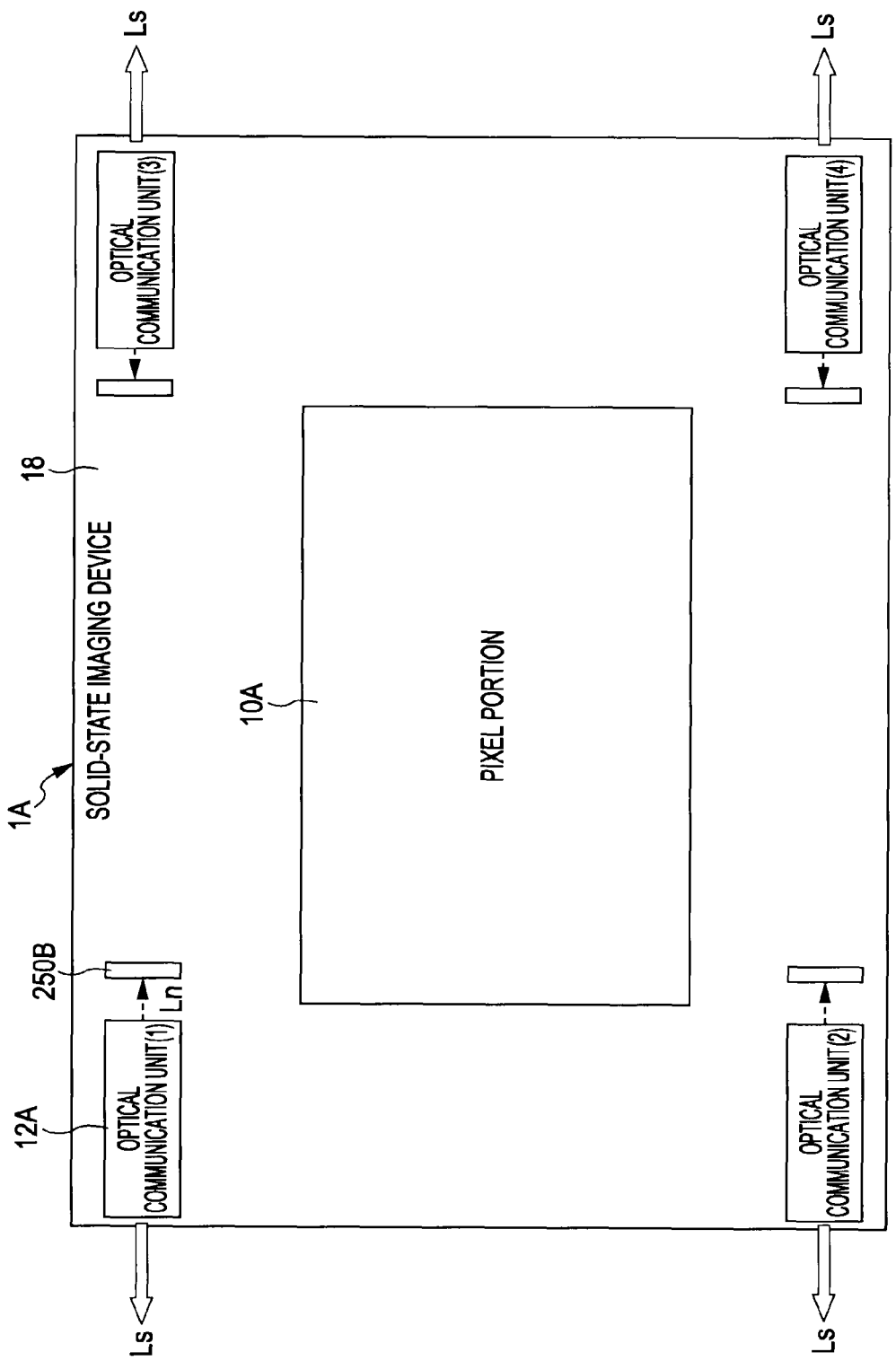
FIG. 28 is a schematic plan view of a solid-state imaging device illustrating a configuration example of a light shielding portion of a self-emitting optical communication unit disposed discretely.

(5) Configuration Example of Light Shielding Portion of Self-emitting Optical Communication Units Disposed Discretely FIG. 28 is a schematic plan view of a solid-state imaging device illustrating a configuration example of a light shielding portion of a self-emitting optical communication unit disposed discretely. With the solid-state imaging device 1A, the single optical communication unit 12A is disposed discretely at four corners in the vicinity portion of the substrate 18. The optical communication units 12A include, for example, an edge-emitting semiconductor laser as an optical output unit. With the example shown in FIG. 28, the optical communication units 12A are disposed such that the direction where the signal light Ls is output is the direction generally perpendicular to the side of the substrate 18.

The solid-state imaging device 1A includes a light shielding portion 2502 around each of the optical communication units 12A. The light shielding portion 250B is configured of a material which does not transmit at least light having an oscillation wavelength. In the case that an edge-emitting semiconductor laser is employed as a light emitting element, the light shielding portion 250B is formed at a position facing the edge face of the opposite side of the output edge of the signal light Ls with each of the optical communication units 12A. Thus, with the solid-state imaging device 1A where the self-emitting optical communication units 12A are formed discretely in multiple places of the substrate 18, leakage light Ln from the optical communication units 12A can be prevented from inputting to the pixel portion 10A. Note that an arrangement may be made wherein the light shielding portion 250B reflects or refracts leakage light or the like to distribute this, thereby preventing this from inputting to the pixel portion 10A.

Figure 29:
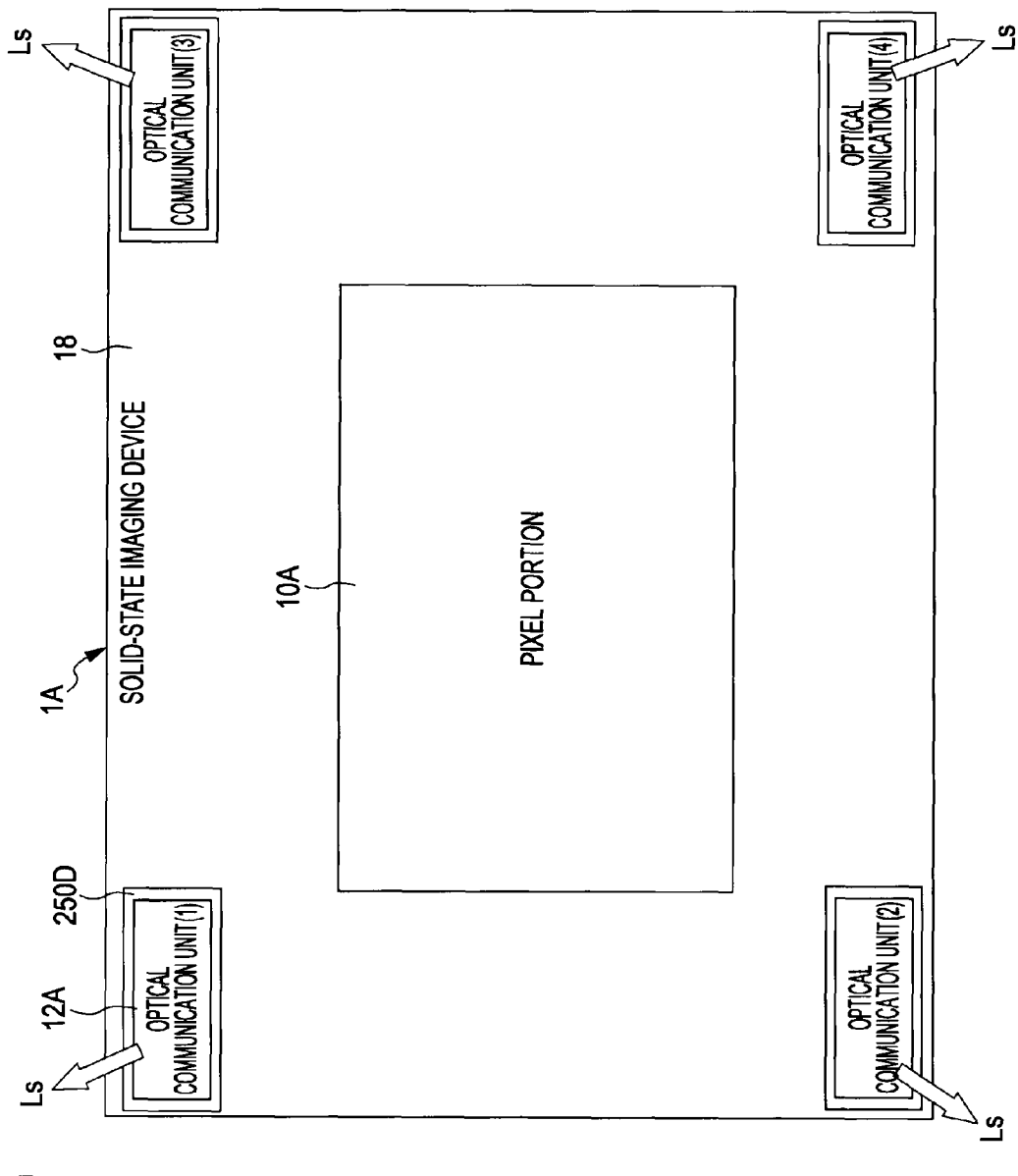
FIG. 29 is a schematic plan view of a solid-state imaging device illustrating another configuration example of a light shielding portion of a self-emitting optical communication unit disposed discretely.

(6) Another Configuration Example of Light Shielding Portion of Self-emitting Optical Communication Units Disposed Discretely FIG. 29 is a schematic plan view of a solid-state imaging device illustrating another configuration example of a light shielding portion of a self-emitting optical communication unit disposed discretely. With the solid-state imaging device 1A, the single optical communication unit 12A is disposed discretely at four corners in the vicinity portion of the substrate 18. The optical communication units 12A include, for example, a surface-emitting semiconductor laser as an optical output unit. Here, the direction where the signal light Ls shown in FIG. 29 is schematically illustrated, and the signal light Ls is output generally in the vertical direction as to the substrate 18.

The solid-state imaging device 1A includes a light shielding portion 250D around each of the optical communication units 12A. The light shielding portion 250D is configured of a material which does not transmit at least light having an oscillation wavelength. In the case that a surface-emitting semiconductor laser is employed as a light emitting element, the light shielding portion 250D is formed on the lower face each of the optical communication units 12A. Thus, with the solid-state imaging device 1A where the self-emitting optical communication units 12A are formed discretely in multiple places of the substrate 18, leakage light Ln from the optical communication units 12A can be prevented from passing through the substrate 18 and inputting to the pixel portion 10A. Note that an arrangement may be made wherein the light shielding portion 250D reflects or refracts leakage light or the like to distribute this, thereby preventing this from inputting to the pixel portion 10A.

Figure 30:
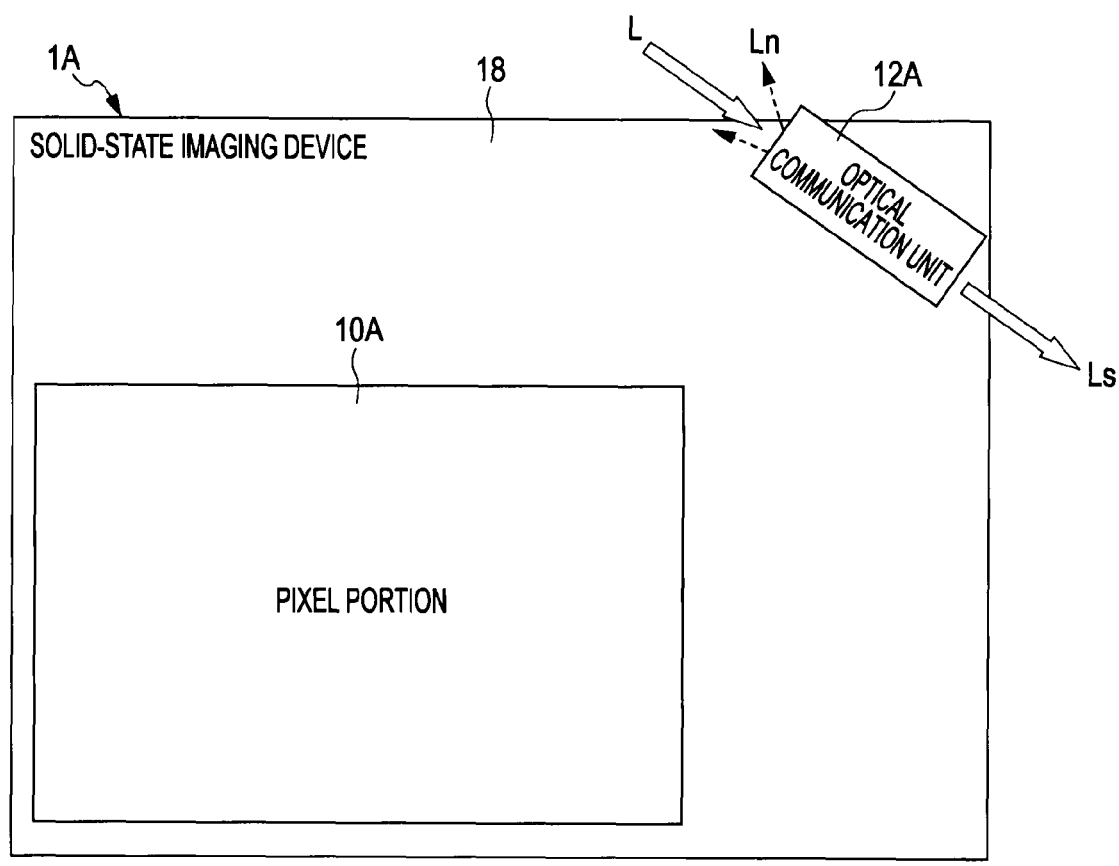
FIG. 30 is a schematic plan view of a solid-state imaging device illustrating a configuration example of a light shielding portion of an external-modulating optical communication unit disposed grouped.

(7) Configuration Example of Light Shielding Portion of External-modulating Optical Communication Units Disposed Grouped FIG. 30 is a schematic plan view of a solid-state imaging device illustrating a configuration example of a light shielding portion of an external-modulating optical communication unit disposed discretely. With the example in FIG. 30, light shielding is realized with a layout of the optical communication unit 12A, and no light shielding portion is provided as another member.

With the solid-state imaging device 1A, the single optical communication unit 12A is disposed grouped in one corner portion of the peripheral portion of the substrate 18. The optical communication unit 12A includes, for example, an external-modulating optical modulating unit as an optical output unit. With an external-modulating optical modulating unit, the signal light Ls is output from one edge face. Also, fixed light is also output from the edge face of the opposite side thereof. Therefore, the optical communication unit 12A including an external-modulating optical modulating unit is disposed inclined in a direction where the input light L and the signal light Ls do not face the pixel portion 10A. Thus, leakage light Ln can be prevented from inputting to the pixel portion 10A. Note that, an example including the single optical communication unit 12A including the single optical output unit has been described in FIG. 30, but the optical communication unit in which the optical output units are arrayed, or the multiple optical communication units may be provided.

Figure 31:
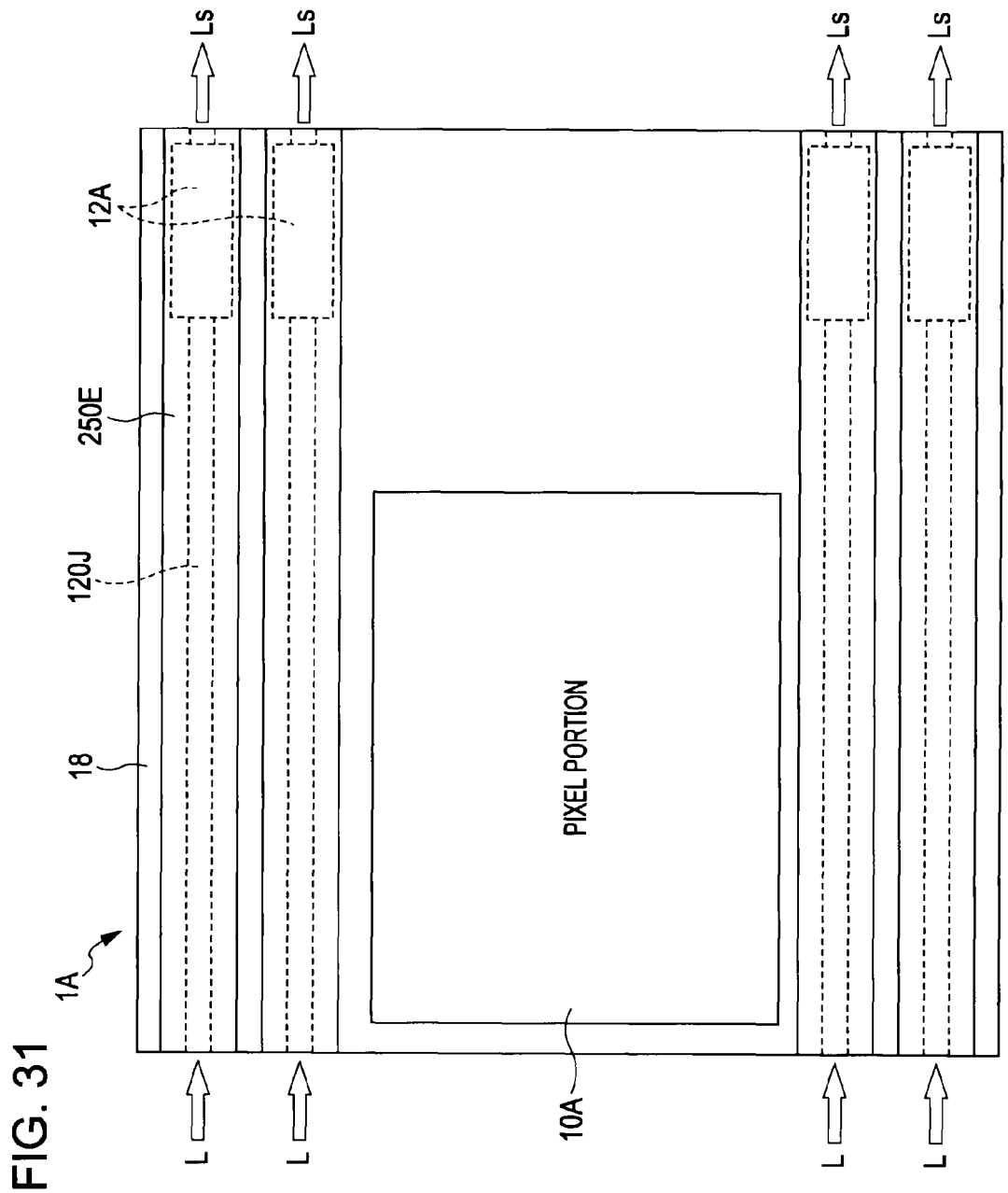
FIG. 31 is a schematic plan view of a solid-state imaging device illustrating a configuration example of a light shielding portion of an external-modulating optical communication unit disposed grouped.

(8) Configuration Example of Light Shielding Portion of External-modulating Optical Communication Units Disposed Discretely Grouped FIG. 31 is a schematic plan view of a solid-state imaging device illustrating a configuration example of a light shielding portion of an external-modulating optical communication unit disposed discretely grouped. With the solid-state imaging device 1A, the multiple optical communication units 12A are disposed discretely grouped at two corners in the vicinity portion of the substrate 18. The optical communication units 12A have a configuration such as described in FIGS. 15 and 16, wherein an external-modulating optical modulating unit is provided as an optical output unit.

The solid-state imaging device 1A includes a light shielding portion 250E around the optical communication units 12A. The light shielding portion 250E is configured of a material which does not transmit light having a wavelength to be input to the optical communication units 12A. In the case that an external-modulating optical modulating unit is employed as an optical output unit, the light shielding portion 250E is formed around a waveguide path other than the input/output portion of light to the optical modulating unit, as shown in FIGS. 15 and 16. With the example in FIG. 31, an input light unit 120J is formed up to the edge portion of the substrate 18 on the opposite side of the side where the optical communication units 12A are disposed. Therefore, the light shielding portion 250E is formed as to other than an input portion corresponding to the input light unit 120J. Thus, with the solid-state imaging device 1A where the external-modulating optical communication units 12A are formed discretely grouped in multiple places of the substrate 18, the light input/output to/from the optical communication units 12A can be prevented from inputting to the pixel portion 10A as stray light.

Figure 32:
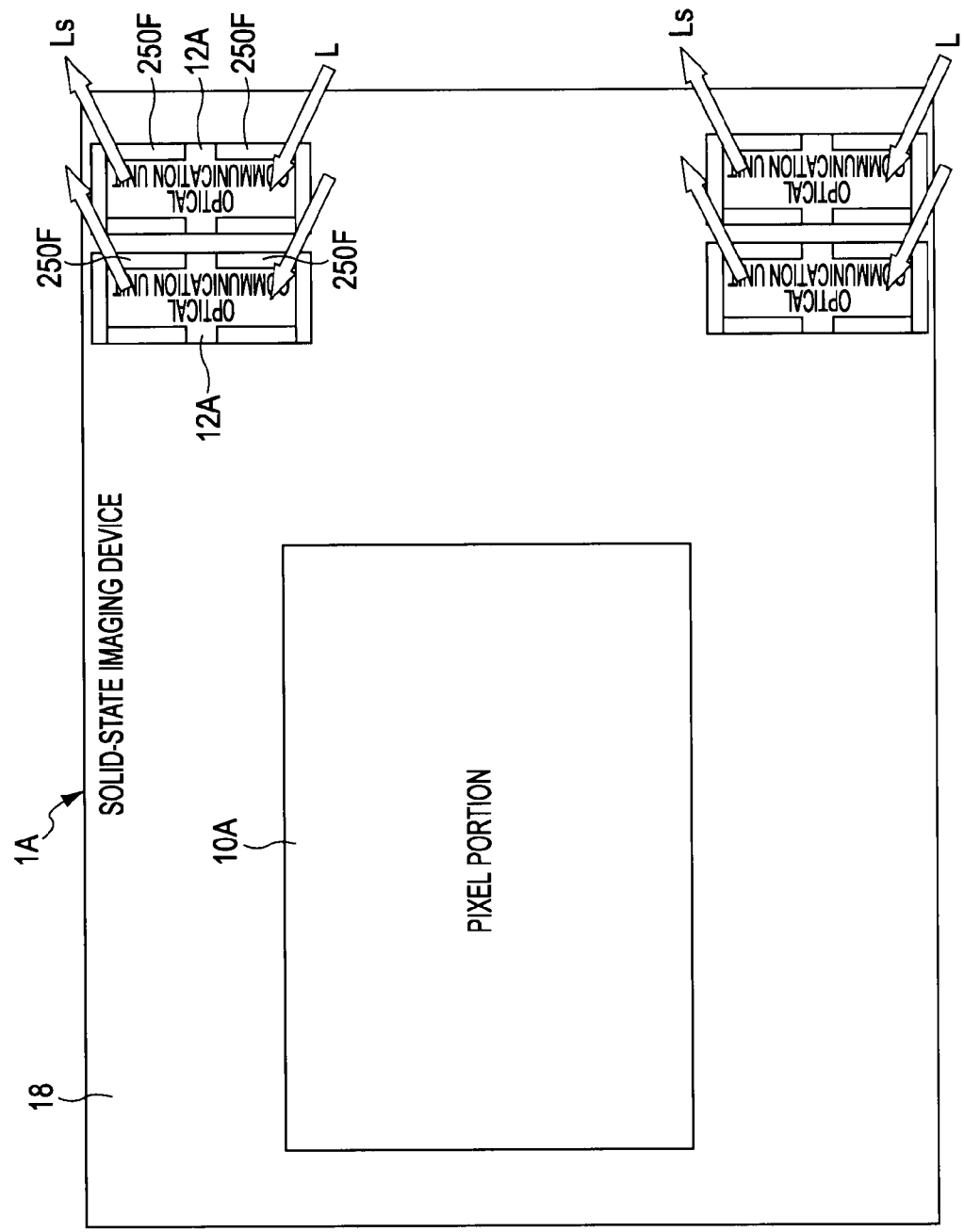
FIG. 32 is a schematic plan view of a solid-state imaging device illustrating a configuration example of a light shielding portion of an external-modulating optical communication unit disposed discretely grouped.

(9) Another Configuration Example of Light Shielding Portion of External-modulating Optical Communication Units Disposed Discretely Correctively FIG. 32 is a schematic plan view of a solid-state imaging device illustrating another configuration example of a light shielding portion of an external-modulating optical communication unit disposed discretely grouped. With the solid-state imaging device 1A, the multiple optical communication units 12A are disposed discretely grouped at two corners in the vicinity portion of the substrate 18. The optical communication units 12A have a configuration such as described in FIGS. 17 and 18, wherein an external-modulating optical modulating unit is provided as an optical output unit.

The solid-state imaging device 1A includes a light shielding portion 250F around the optical communication units 12A. The light shielding portion 250F is configured of a material which does not transmit light having a wavelength to be input to the optical communication units 12A. In the case that an external-modulating optical modulating unit is employed as an optical output unit, the light shielding portion 250F is formed around a waveguide path other than the input/output portion of light to the optical modulating unit, as shown in FIGS. 17 and 18. Thus, with the solid-state imaging device 1A where the external-modulating optical communication units 12A are formed discretely grouped in multiple places of the substrate 18, the light input/output to/from the optical communication units 12A can be prevented from inputting to the pixel portion 10A as stray light. Note that an arrangement may be made wherein the light shielding portion 250F reflects or refracts leakage light or the like to distribute this, thereby preventing this from inputting to the pixel portion 10A.

Figure 33:
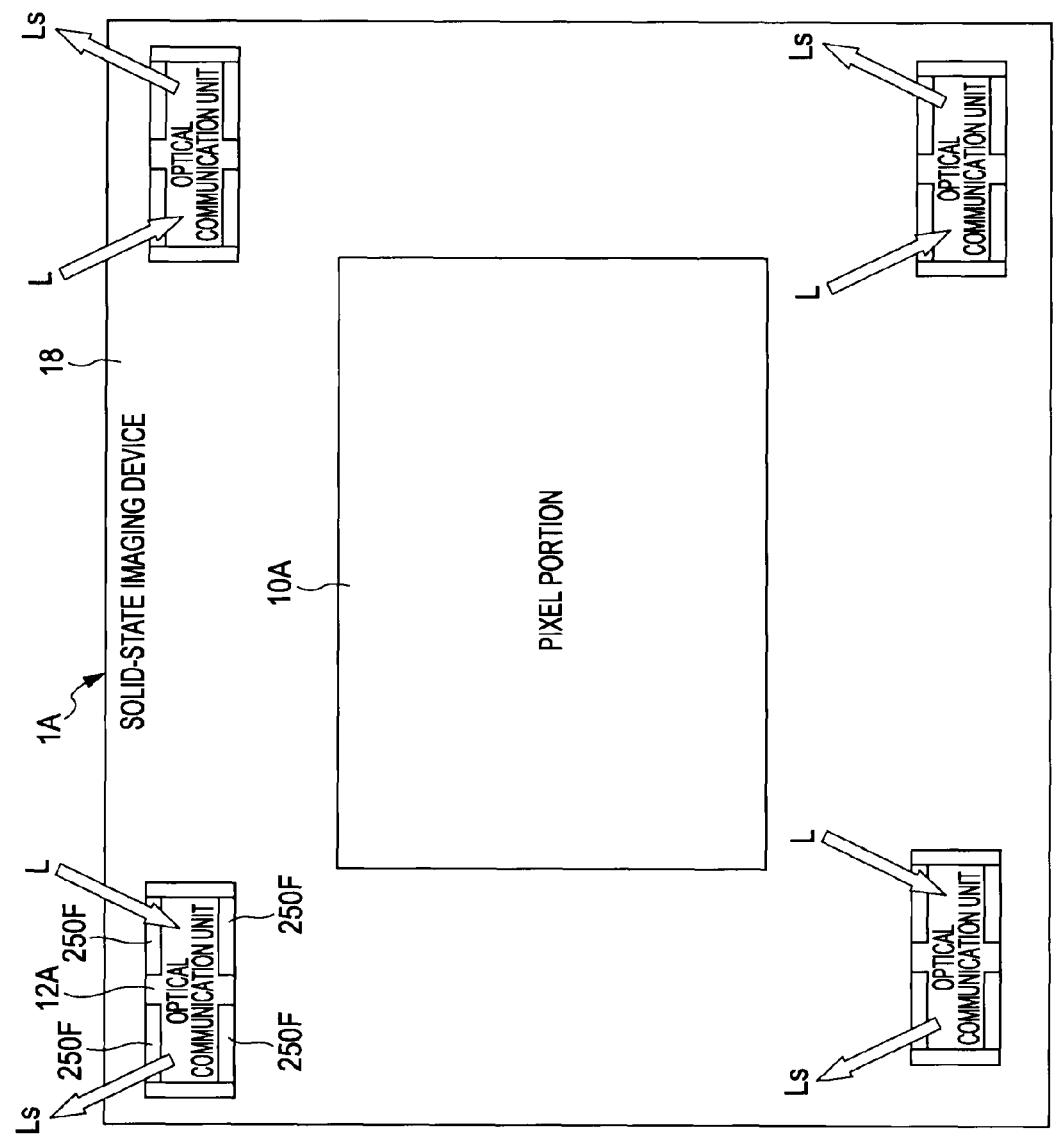
FIG. 33 is a schematic plan view of a solid-state imaging device illustrating a configuration example of a light shielding portion of an external-modulating optical communication unit disposed discretely.

(10) Configuration Example of Light Shielding Portion of External-modulating Optical Communication Units Disposed Discretely FIG. 33 is a schematic plan view of a solid-state imaging device illustrating a configuration example of a light shielding portion of an external-modulating optical communication unit disposed discretely. With the solid-state imaging device 1A, the multiple optical communication units 12A are disposed discretely at four corners in the vicinity portion of the substrate 18. The optical communication units 12A have a configuration such as described in FIGS. 17 and 18, wherein an external-modulating optical modulating unit is provided as an optical output unit.

The solid-state imaging device 1A includes a light shielding portion 250F around the optical communication units 12A. The light shielding portion 250F is configured of a material which does not transmit light having a wavelength to be input to the optical communication units 12A. In the case that an external-modulating optical modulating unit is employed as an optical output unit, the light shielding portion 250F is formed around a waveguide path other than the input/output portion of light to the optical modulating unit, as shown in FIGS. 17 and 18. Thus, with the solid-state imaging device 1A where the external-modulating optical communication units 12A are formed discretely in multiple places of the substrate 18, the light input/output to/from the optical communication units 12A can be prevented from inputting to the pixel portion 10A as leakage light. Note that an arrangement may be made wherein the light shielding portion 250F reflects or refracts leakage light or the like to distribute this, thereby preventing this from inputting to the pixel portion 10A.

Figure 34:
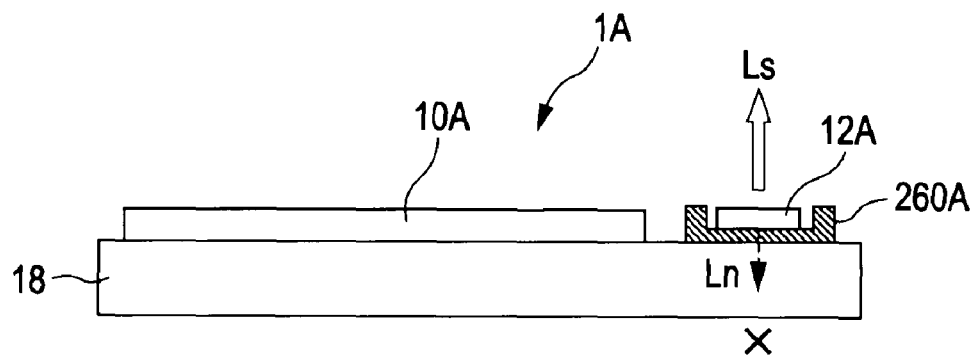
FIG. 34 is a schematic side view of a solid-state imaging device illustrating a first layout example of a light shielding portion.
Figure 35:
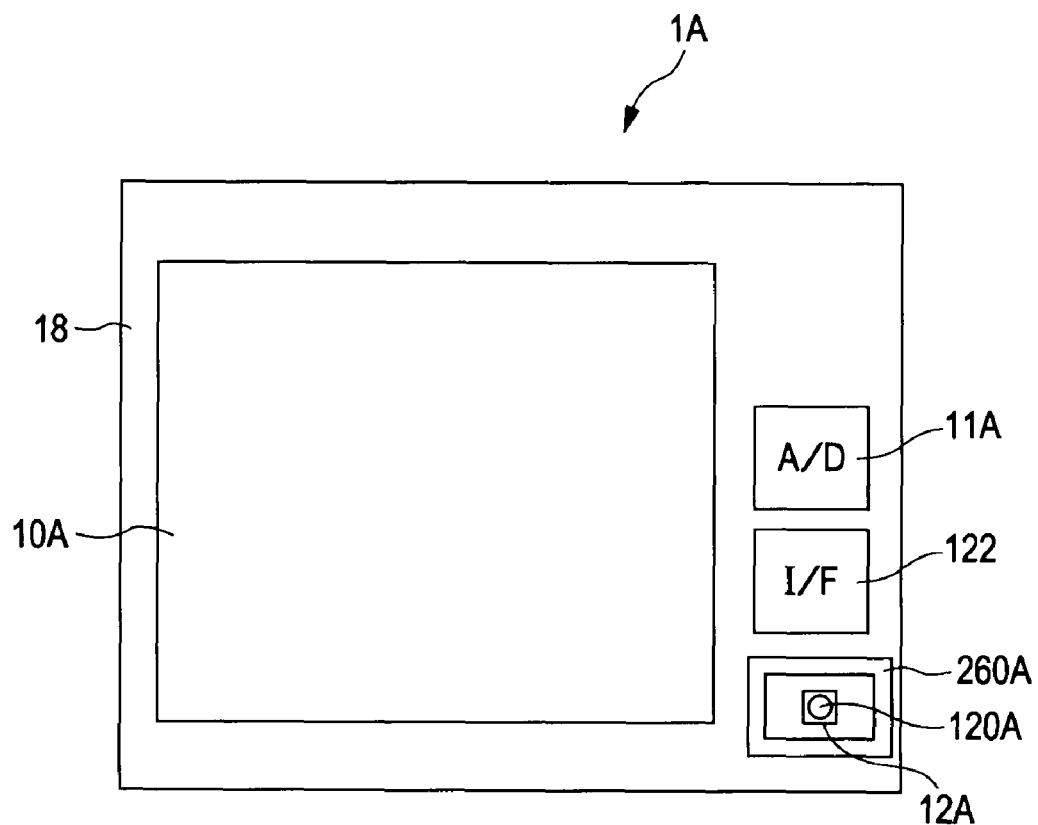
FIG. 35 is a schematic plan view of the solid-state imaging device illustrating the first layout example of the light shielding portion.

Layout Example of Light Shielding Portion According to Layout of Optical Communication Units (1) First Layout Example of Light Shielding Portion FIG. 34 is a schematic side view of a solid-state imaging device illustrating a first layout example of a light shielding portion, and FIG. 35 is a schematic plan view of the solid-state imaging device illustrating the first layout example of the light shielding portion. With the solid-state imaging device 1A, for example, as a layout according to serialization of pixel data, the single optical communication unit 12A including the single optical output unit 120A is disposed in one corner of the peripheral portion of the substrate 18.

With a method wherein pixel data read out from the pixel portion 10A is serialized and transmitted, a serial interface 122 is provided to the subsequent stage of the A/D conversion unit 11A described in FIG. 3, and the optical communication unit 12A is disposed to the output of the serial interface 122. Therefore, the optical communication unit 12A is disposed, for example, on the right side of the pixel portion 10A.

With the solid-state imaging device 1A, a light shielding portion 260A is provided around the optical communication unit 12A. In the case of a configuration wherein the optical communication unit 12A includes a self-emitting light emitting element, the light shielding portion 260A is configured of a material which does not transmit at least light having an oscillation wavelength. Therefore, in the case of a configuration wherein the above surface-emitting semiconductor laser is used as a light emitting element, the light shielding portion 260A is configured so as to surround the circumference other than the upper face which is the light emitting face of the optical communication unit 12A as a configuration wherein the lower face and the side face of the optical communication unit 12A are covered with, for example, a plate-shaped member.

Thus, the leakage light Ln from the optical communication unit 12A can be prevented from not propagating through the substrate 18 but inputting to the pixel portion 10A as stray light. Also, the signal light output from the optical communication unit 12A can be prevented from being reflected at the lens or the like and being diffracted around the pixel portion 10A.

(2) Second Layout Example of Light Shielding Portion

Figure 36:
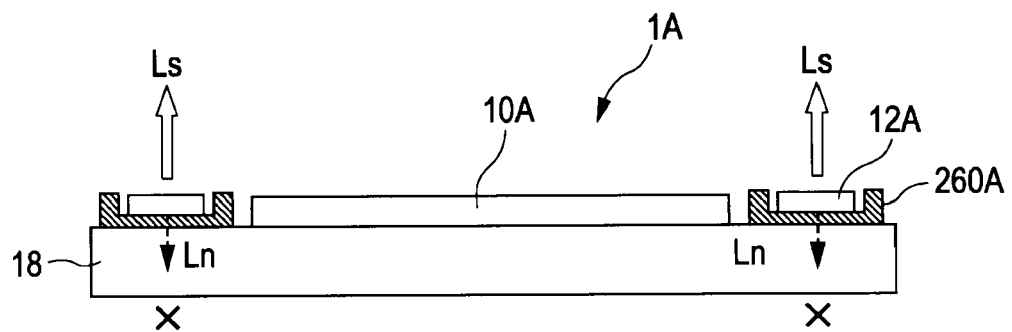
FIG. 36 is a schematic side view of a solid-state imaging device illustrating a second layout example of light shielding portions.
Figure 37:
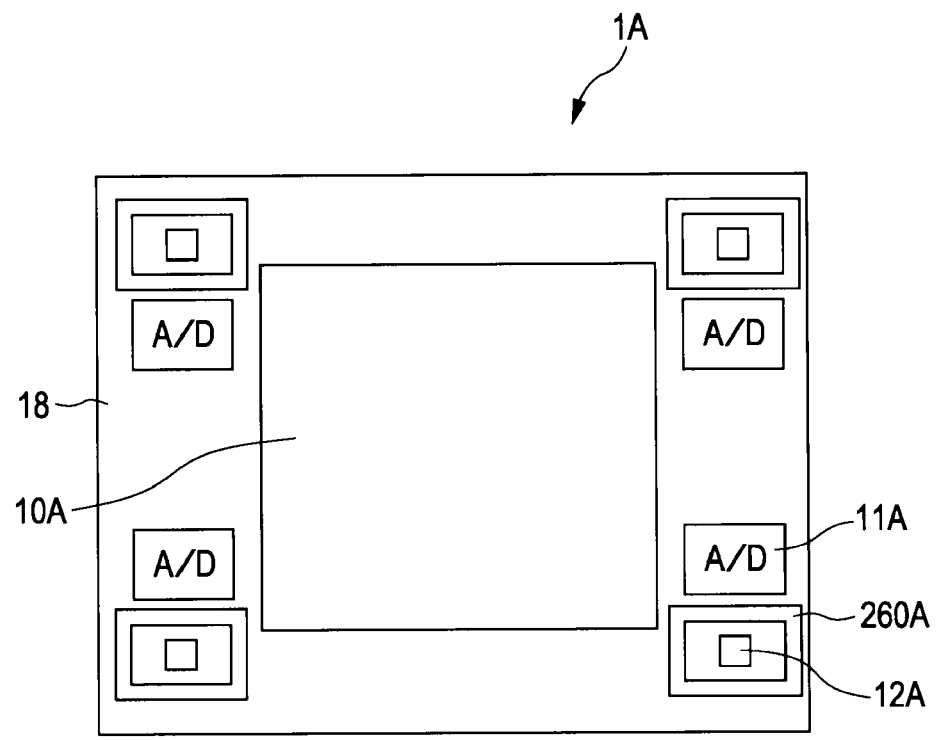
FIG. 37 is a schematic plan view of the solid-state imaging device illustrating the second layout example of the light shielding portions.

FIG. 36 is a schematic side view of a solid-state imaging device illustrating a second layout example of light shielding portions, and FIG. 37 is a schematic plan view of the solid-state imaging device illustrating the second layout example of the light shielding portions. With the solid-state imaging device 1A, for example, as a layout according to area readout, the single optical communication unit 12A where the optical output units are arrayed is disposed in four corners of the peripheral portion of the substrate 18. Note that, in the case of a configuration including a serial interface, the optical communication units including the single optical output unit are disposed.

"Area readout" means a method wherein the pixel portion 10A is divided into several areas, and readout of a signal is executed for each pixel disposed within each area. For example, in the case of a method wherein the pixel portion 10A is divided into four of (1) through (4) to execute area readout, the A/D conversion unit 11A is connected for each area. Therefore, the optical communication unit 12A is disposed in four corners of the peripheral portion of the substrate 18.

With the solid-state imaging device 1A, the above-mentioned light shielding portion 260A is provided around each of the optical communication units 12A. Thus, the leakage light Ln from each of the optical communication units 12A can be prevented from not propagating through the substrate 18 but inputting to the pixel portion 10A as stray light. Also, the signal light output from each of the optical communication units 12A can be prevented from being reflected at the lens or the like and being diffracted around the pixel portion 10A.

(3) Third Layout Example of Light Shielding Portion

Figure 38:
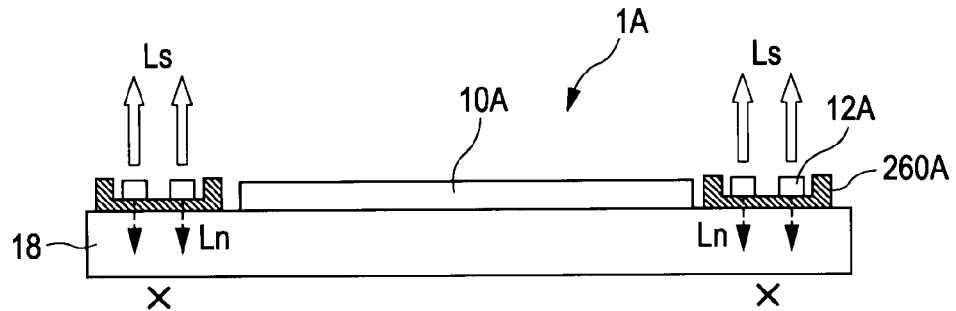
FIG. 38 is a schematic side view of a solid-state imaging device illustrating a third layout example of light shielding portions.
Figure 39:
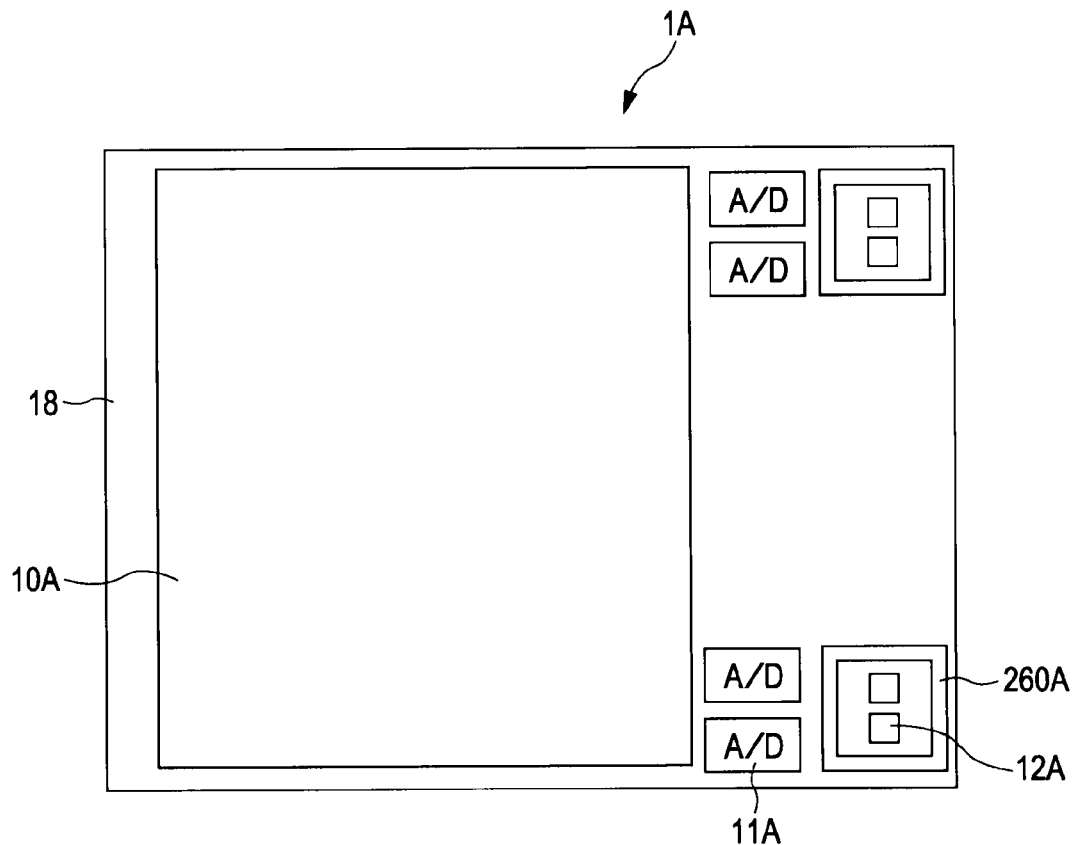
FIG. 39 is a schematic plan view of the solid-state imaging device illustrating the third layout example of the light shielding portions.

FIG. 38 is a schematic side view of a solid-state imaging device illustrating a third layout example of light shielding portions, and FIG. 39 is a schematic plan view of the solid-state imaging device illustrating the third layout example of the light shielding portions. With the solid-state imaging device 1A, for example, as a layout according to multi-line readout according to pixel property, the single optical communication unit 12A where the optical output units are arrayed is disposed in two places of one side edge portion of the peripheral portion of the substrate 18. Note that, in the case of a configuration including a serial interface, the optical communication units including the single optical output unit are disposed.

"Multi-line readout according to pixel property" means a method wherein pixels making up the pixel portion 10A are classified according to a property such as color or the like, and readout of a signal is executed. For example, in the case that the pixel property is classified into four types, the four A/D conversion units 11A are disposed on one edge portion of the substrate 18 corresponding to the classified pixels, respectively. Therefore, the optical communication unit 12A is disposed in two vertical places of one side edge portion of the peripheral portion of the substrate 18.

With the solid-state imaging device 1A, the above-mentioned light shielding portion 260A is provided around each of the optical communication units 12A. Thus, the leakage light Ln from each of the optical communication units 12A can be prevented from not propagating through the substrate 18 but inputting to the pixel portion 10A as stray light. Also, the signal light output from each of the optical communication units 12A can be prevented from being reflected at the lens or the like and being diffracted around the pixel portion 10A.

(4) Fourth Layout Example of Light Shielding Portion

Figure 40:
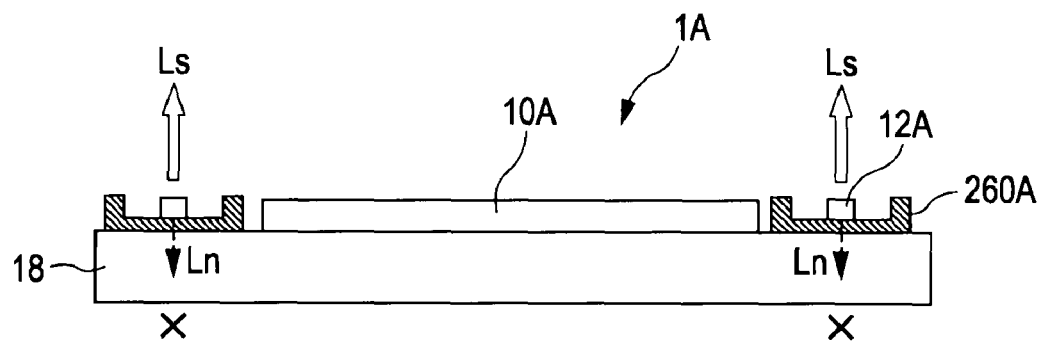
FIG. 40 is a schematic side view of a solid-state imaging device illustrating a fourth layout example of light shielding portions.
Figure 41:
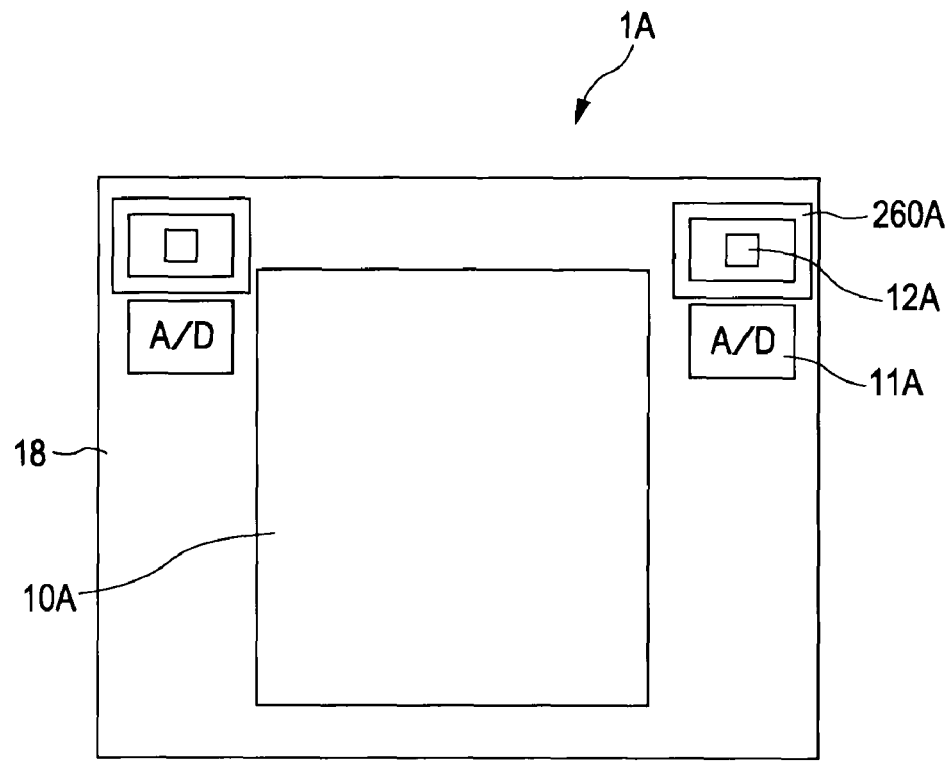
FIG. 41 is a schematic plan view of the solid-state imaging device illustrating the fourth layout example of the light shielding portions.

FIG. 40 is a schematic side view of a solid-state imaging device illustrating a fourth layout example of light shielding portions, and FIG. 41 is a schematic plan view of the solid-state imaging device illustrating the fourth layout example of the light shielding portions. With the solid-state imaging device 1A, for example, as a layout according to French-door readout, the single optical communication unit 12A where the optical output units are arrayed is disposed on both edges of the peripheral portion on the upper or lower side of the substrate 18. Note that, in the case of a configuration including a serial interface, the optical communication units including the single optical output unit are disposed.

"French-door readout" means a method wherein the pixel portion 10A is divided into right and left areas, and readout of a signal is executed for each pixel disposed within each area, and the A/D conversion unit 11A is connected for each area. Therefore, the optical communication unit 12A is disposed on both edges of the peripheral portion on the upper or lower side of the substrate 18.

With the solid-state imaging device 1A, the above-mentioned light shielding portion 260A is provided around each of the optical communication units 12A. Thus, the leakage light Ln from each of the optical communication units 12A can be prevented from not propagating through the substrate 18 but inputting to the pixel portion 10A as stray light. Also, the signal light output from each of the optical communication units 12A can be prevented from being reflected at the lens or the like and being diffracted around the pixel portion 10A. Note that, with each of the above examples, an arrangement may be made wherein leakage light or the like is reflected or refracted to distribute, and accordingly, such light is prevented from inputting to the pixel portion 10A.

Overview of Signal Processing System Including Solid-State Imaging Device

Figure 42:
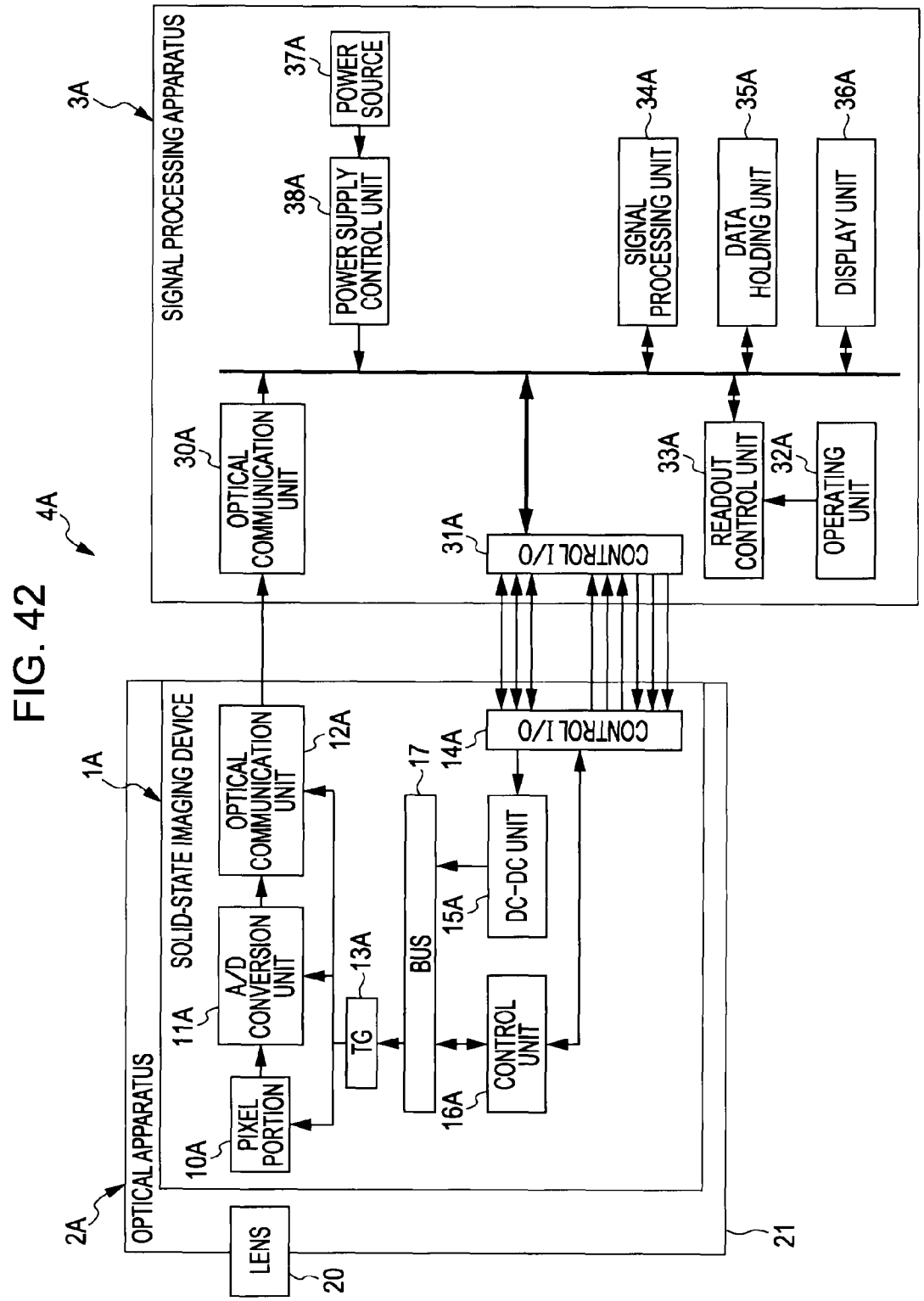
FIG. 42 is a functional block diagram illustrating an overview of a signal processing system including a solid-state imaging device.

FIG. 42 is a functional block diagram illustrating an overview of a signal processing system including a solid-state imaging device. First, the overview of an optical apparatus having the solid-state imaging device will be described. An optical apparatus 2A includes the above solid-state imaging device 1A, a lens portion 20, and a housing 21 in which the solid-state imaging device 1A and the lens portion 20 and so forth are mounted, which make up, for example, a lens unit of a camera system. The lens portion 20 is an example of an optical element, and is configured of a single lens or a combination of multiple lenses.

The optical apparatus 2A is configured such that the pixel portion 10A of the solid-state imaging device 1A is matched with the focal position of the lens portion 20, and the image of light input from the lens portion 20 is formed on the pixel portion 10A of the solid-state imaging device 1A.

The optical apparatus 2A sets the focus position of the lens portion 20 to the pixel portion 10A of the solid-state imaging device 1A regardless of distance as to an object to be imaged, and accordingly, includes, for example, a focusing mechanism which moves the lens portion 20 in the optical axis direction as to the solid-state imaging device 1A.

Next, description will be made regarding an overview of a signal processing apparatus to which the optical apparatus is connected. A signal processing apparatus 3A includes an optical communication unit 30A which converts an optical signal to an electric signal, and control I/O 31A where input/output such as a control signal or the like is executed, and makes up, for example, a camera main unit of a camera system. Upon an optical apparatus 2A being connected thereto, the optical communication unit 30A is optically connected to the optical communication unit 12A of the solid-state imaging device 1A. Also, the control I/O 31A is connected to control I/O 14A of the solid-state imaging device 1A.

The signal processing apparatus 3A includes an operating unit 32A which accepts operations by the user, and a readout control unit 33A which instructs the solid-state imaging device 1A of the optical apparatus 2A to execute readout of pixel data based on the operations at the operating unit 32A.

The signal processing apparatus 3A instructs the solid-state imaging device 1A of the optical apparatus 2A to execute readout of pixel data from the control I/O 31A, and executes optical communication between the optical communication unit 12A of the solid-state imaging device 1A and the optical communication unit 30A of the self apparatus to obtain pixel data from the solid-state imaging device 1A.

The optical communication unit 30A includes a light receiving element such as a photodiode (PD) or the like as a light receiving unit wherein the signal light Ls output from the optical communication unit 12A of the solid-state imaging device 1A is input, and pixel data input by an optical signal is converted into an electric signal and output this.

Note that, with a configuration wherein the optical communication unit 12A of the solid-state imaging device 1A includes an optical modulator which modulates external light, the optical communication unit 30A of the signal processing apparatus 3A includes a light emitting unit which outputs light to be input to the optical modulator of the solid-state imaging device 1A. The light emitting unit includes a light emitting element such as a semiconductor laser or the like, and outputs fixed continuous light L.

The signal processing apparatus 3A includes a signal processing unit 34A which executes optical communication with the solid-state imaging device 1A, and subjects obtained pixel data to a predetermined signal process to generate image data. Also, the signal processing apparatus 3A includes a data holding unit 35A which holds pixel data obtained from the solid-state imaging device 1A, and a display unit 36A which displays an image from the image data generated at the signal processing unit 34A.

The signal processing apparatus 3A includes a power source 37A which supplies power to the self apparatus and the optical apparatus 2A, and a power control unit 38A which controls power supply. The power control unit 38A executes power supply control wherein power supply to the signal processing apparatus 3A, and power supply to the optical apparatus 2A are switched in a predetermined order based on power on operations and power off operations of the signal processing apparatus 3A.

Next, description will be made regarding an overview of a signal processing system including an optical apparatus and a signal processing apparatus. A signal processing system 4A includes the above optical apparatus 2A and signal processing apparatus 3A, and makes up, for example, a camera system. With the camera system, the optical apparatus 2A which makes up a lens unit is configured so as to be replaced detachably as to the signal processing apparatus 3A making up a camera main unit.

With the signal processing system 4A, upon the signal processing apparatus 3A being connected to the optical apparatus 2A, the optical communication unit 30A of the signal processing apparatus 3A, and the optical communication unit 12A of the solid-state imaging device 1A making up the optical apparatus 2A are optically connected. Also, the control I/O 31A of the signal processing apparatus 3A, and the control I/O 14A of the solid-state imaging device 1A are connected.

Thus, with the signal processing system 4A, input/output of data is executed by optical signals between the optical apparatus 2A and the signal processing apparatus 3A by the optical communication unit 12A of the solid-state imaging device 1A, and the optical communication unit 30A of the signal processing apparatus 3A.

Also, with the signal processing system 4A, input/output of a control signal is executed between the signal processing apparatus 3A and the optical apparatus 2A by the control I/O 31A of the signal processing apparatus 3A, and the control I/O 14A of the solid-state imaging device 1A. Further, with the signal processing system 4A, power supply is executed between the signal processing apparatus 3A and the optical apparatus 2A by the control I/O 31A of the signal processing apparatus 3A, and the control I/O 14A of the solid-state imaging device 1A.

With the signal processing system 4A, the operating unit 32A of the signal processing apparatus 3A accepts the operation by the user, and based on the operation at the operating unit 32A, the readout control unit 33A of the signal processing apparatus 3A outputs a control signal to instruct readout of pixel data.

With the signal processing system 4A, the control signal to instruct readout of pixel data is input to the solid-state imaging device 1A of the optical apparatus 2A by the control I/O 31A of the signal processing apparatus 3A, and the control I/O 14A of the optical apparatus 2A.

With the signal processing system 4A, upon the control signal to instruct readout of pixel data being input to the solid-state imaging device 1A of the optical apparatus 2A, the control unit 16A of the solid-state imaging device 1A generates a driving clock at the timing generator 13A.

The driving clock generated at the timing generator 13A is supplied to the pixel portion 10A, A/D conversion unit 11A, and optical communication unit 12A, and pixel data is read out as an electric signal at the pixel portion 10A. With the A/D conversion unit 11A, the pixel data read out from the pixel portion 10A is input, converted into a digital signal, and output. With the optical communication unit 12A, the electric signal converted into a digital signal at the A/D conversion unit 11A is input, and the pixel data is converted into signal light Ls and output. Note that, in the case of a configuration wherein the optical communication unit 12A of the solid-state imaging device 1A includes an optical modulator which modulates external light, with the optical communication unit 12A, the fixed light input from the signal processing apparatus 3A is modulated based on the electric signal converted into a digital signal at the A/D conversion unit 11A, and signal light Ls is output.

With the signal processing system 4A, the pixel data read out at the solid-state imaging device 1A is input to the signal processing apparatus 3A through optical communication by the optical communication unit 12A of the solid-state imaging device 1A, and the optical communication unit 30A of the signal processing apparatus 3A.

With the signal processing system 4A, upon the pixel data read out at the solid-state imaging device 1A being input to the signal processing apparatus 3A by optical communication, the optical communication unit 30A of the signal processing apparatus 3A converts the pixel data input by an optical signal into an electric signal, and outputs this.

With the signal processing system 4A, the signal processing unit 34A of the signal processing apparatus 3A subjects the pixel data converted into an electric signal at the optical communication unit 30A of the signal processing apparatus 3A to a predetermined signal process to generate image data, and for example, displays the image on the display unit 36A.

Specific Example of Signal Processing System

Figure 43:
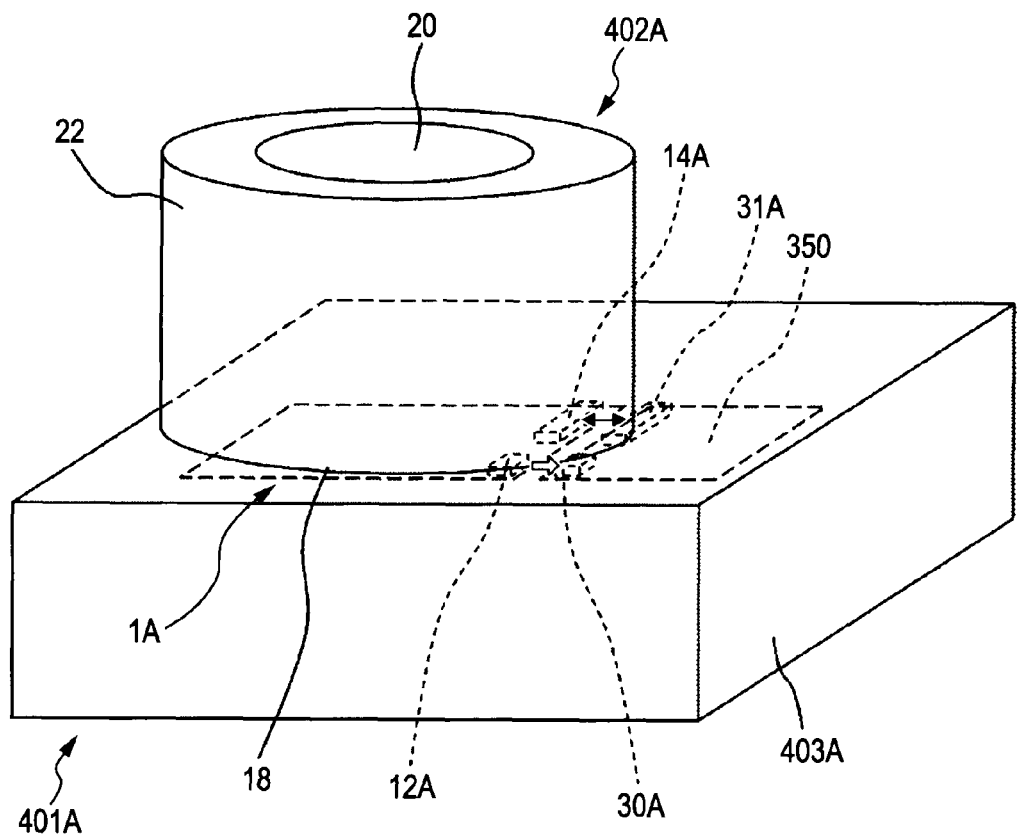
FIG. 43 is a schematic perspective view illustrating an example of a camera system serving as an application of the signal processing system.
Figure 44:
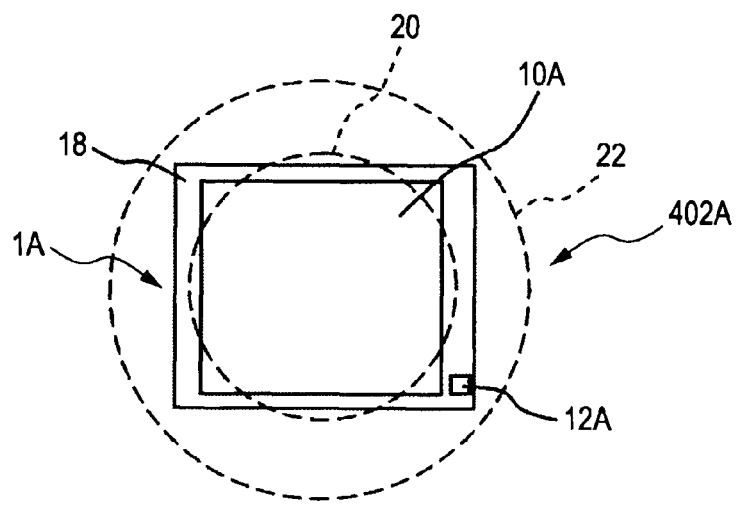
FIG. 44 is a schematic front view of a lens unit making up the camera system.

FIG. 43 is a schematic perspective view illustrating an example of a camera system serving as an application of the signal processing system, and FIG. 44 is a schematic front view of a lens unit making up the camera system. A camera system 401A is configured as an example of the signal processing system 4A described in FIG. 42.

The camera system 401A includes a lens unit 402A as the optical apparatus 2A described in FIG. 42, and also includes a camera main unit 403A as the signal processing apparatus 3A. The lens unit 402A includes a lens portion 20, and a lens barrel 22, and also includes the above solid-state imaging device 1A. With the solid-state imaging device 1A, the size of the pixel portion 10A is, as shown in FIG. 44, stipulated with the lens portion 20 of the lens unit 402A.

The camera main unit 403A includes a signal processing substrate 350 to which the lens unit 402A is attached in an exchangeable manner, for example. The signal processing substrate 350 makes up the signal processing apparatus 3A described in FIG. 42, and upon the lens unit 402A being attached thereto, the optical communication unit 12A of the solid-state imaging device 1A, and the optical communication unit 30A are optically connected. Also, the control I/O 14A of the solid-state imaging device 1A, and the control I/O 31A are connected.

With the solid-state imaging device 1A, as described above, the optical communication unit 12A is provided on the surface side of the substrate 18. In the case that the solid-state imaging device 1A includes an edge-emitting semiconductor laser as the optical communication unit 12A, signal light is output in a direction level to the surface of the substrate 18. Thus, when the lens unit 402A is attached to the camera main unit 403A, the signal processing substrate 350 should be provided in parallel with a lateral direction of the solid-state imaging device 1A, e.g., horizontal direction.

Figure 45:
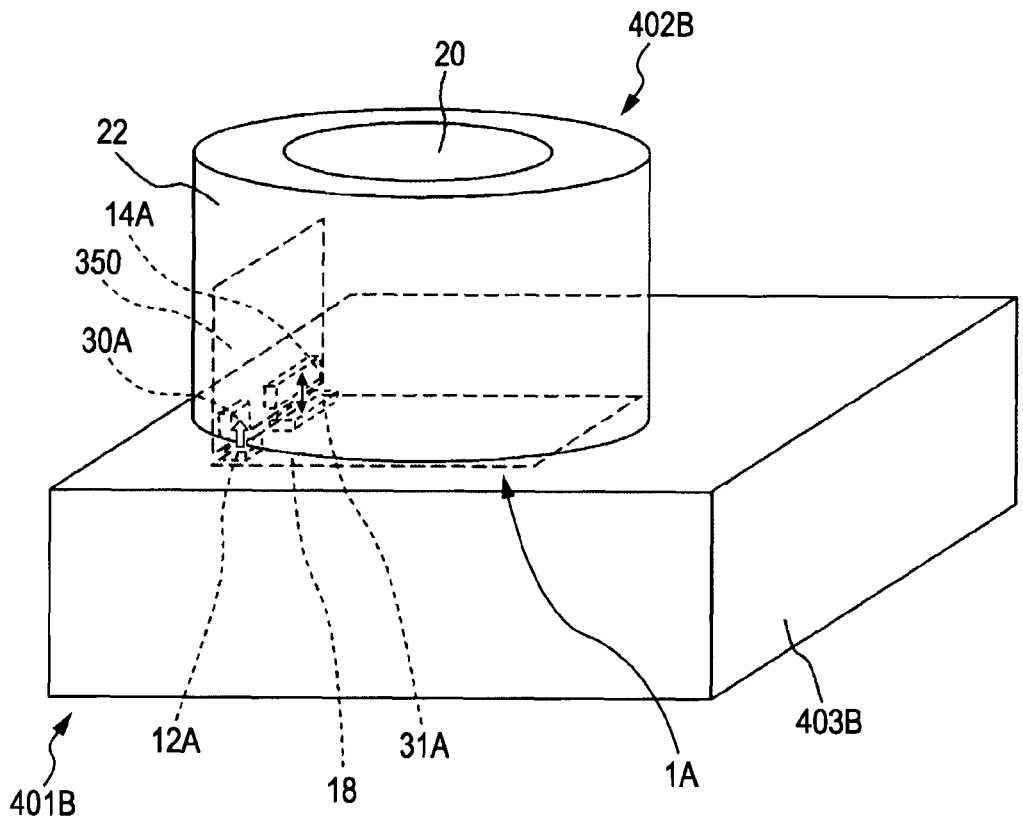
FIG. 45 is a schematic perspective view illustrating another example of a camera system serving as an application of the signal processing system.
Figure 46:
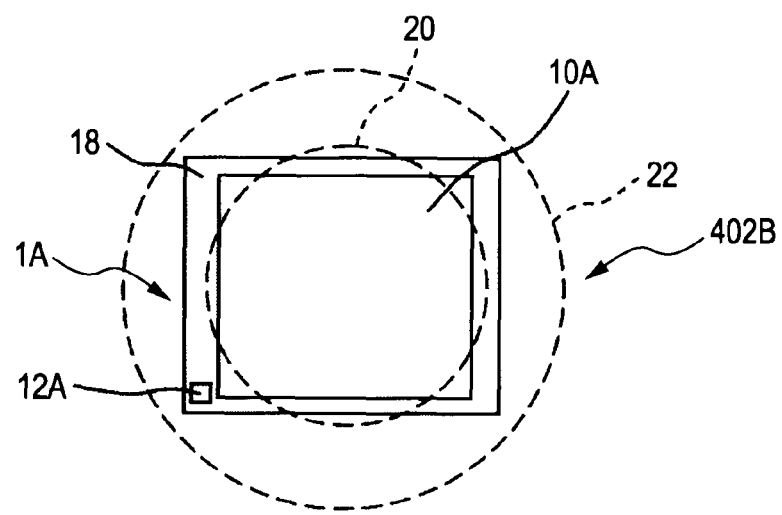
FIG. 46 is a schematic front view of a lens unit making up the camera system.

FIG. 45 is a schematic perspective view illustrating another example of a camera system serving as an application of the signal processing system, and FIG. 46 is a schematic front view of a lens unit making up the camera system. A camera system 401B is configured as an example of the signal processing system 4A described in FIG. 42.

The camera system 401B includes a lens unit 402B as the optical apparatus 2A described in FIG. 42, and also includes a camera main unit 403B. The lens unit 402B includes a lens portion 20, and a lens barrel 22, and also includes the above solid-state imaging device 1A. With the solid-state imaging device 1A, the size of the pixel portion 10A is, as shown in FIG. 46, stipulated with the lens portion 20 of the lens unit 402B.

The camera main unit 403B includes a signal processing substrate 350 to which the lens unit 402B is attached in an exchangeable manner, for example. The signal processing substrate 350 makes up the signal processing apparatus 3A described in FIG. 42, and upon the lens unit 402B being attached thereto, the optical communication unit 12A of the solid-state imaging device 1A, and the optical communication unit 30A are optically connected. Also, the control I/O 14A of the solid-state imaging device 1A, and the control I/O 31A are connected.

With the solid-state imaging device 1A, as described above, the optical communication unit 12A is provided on the surface side of the substrate 18. In the case that the solid-state imaging device 1A includes a surface-emitting semiconductor laser as the optical communication unit 12A, signal light is output in a direction perpendicular to the surface of the substrate 18. Thus, when the lens unit 402B is attached to the camera main unit 403B, the signal processing substrate 350 should be provided longitudinally in the vertical direction of the solid-state imaging device 1A.

Thus, the direction or the like of the signal processing substrate 350 to which the solid-state imaging device 1A is connected can be determined according to the configuration of the optical communication unit 12A, whereby the flexibility of the camera main unit, and the signal processing apparatus to which the solid-state imaging apparatus is connected improves. For example, an arrangement may be made wherein the lens unit is integral with the camera main unit, and the signal processing substrate is housed in the lens unit.
Example of Advantages of Solid-State Imaging Device where Light Shielding Portion is Disposed With the solid-state imaging device according to each of the above embodiments, assumption has been made wherein transmission of a pixel signal read out from the pixel portion is executed by way of an optical signal, and also a light shielding portion is provided to the optical communication unit. Thus, signal light output from the optical communication unit, and light leaked from the optical communication unit can be prevented from inputting to the pixel portion. Also, light input to the pixel portion can be prevented from being mixed with signal light output from the optical communication unit.

The present application contains subject matter related to that disclosed in Japanese Priority Patent Application JP 2008-264584 filed in the Japan Patent Office on Oct. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a pixel portion configured to convert light into an electric signal;
   a substrate where said pixel portion is formed;
   an optical communication unit configured to convert a signal read out from said pixel portion into an optical signal, and outputs the optical signal, which is disposed in one surface where said pixel portion is formed of said substrate; and
   a light shielding portion configured to shield, of signal light to be output from said optical communication unit, light that directs to said pixel portion, and light to be leaked from said optical communication unit, which is disposed around said optical communication unit.

2. The solid-state imaging device according to claim 1, said optical communication unit comprising:
   a surface-emitting light emitting element;
   wherein said light shielding portion is formed on the lower face and side face of said optical communication unit.

3. The solid-state imaging device according to claim 1, said optical communication unit comprising:
   an edge-emitting light emitting element;
   wherein said light shielding portion is formed in a position facing the face where the leakage light of said optical communication unit is output.

4. The solid-state imaging device according to claim 1, said optical communication unit comprising:
   an edge-emitting light emitting element;
   wherein said optical communication unit is formed with a layout where light to be output from said optical communication unit directs to the outside of said pixel portion.

5. The solid-state imaging device according to claim 1, said optical communication unit comprising:
   an external-modulating modulator;
   wherein said light shielding portion is formed in a position facing the face where light input/output to/from said optical communication unit leaks.

6. The solid-state imaging device according to claim 1, said optical communication unit comprising:
   an external-modulating modulator;
   wherein said optical communication unit is formed at a layout where light input/output to/from said optical communication unit directs to the outside of said pixel portion.

7. The solid-state imaging device according to claim 1, wherein said single optical communication unit or a plurality of said optical communication units are disposed grouped in the peripheral portion of said substrate around said pixel portion;
   and wherein said light shielding portion is disposed around said optical communication units disposed grouped.

8. The solid-state imaging device according to claim 1, wherein said single optical communication unit is disposed discretely in the peripheral portion of said substrate around said pixel portion;
   and wherein said light shielding portion is disposed around said optical communication unit disposed discretely.

9. The solid-state imaging device according to claim 1, wherein a plurality of said single optical communication units are disposed discretely grouped in the peripheral portion of said substrate around said pixel portion;

and wherein said light shielding portion is disposed around said optical communication units disposed discretely grouped.

10. A signal processing system comprising:
an optical apparatus including
  a solid-state imaging device configured to convert incident light into an electric signal, and
  an optical element configured to allow said solid-state imaging device to input light; and
a signal processing apparatus to which said optical apparatus is connected;
wherein said solid-state imaging device includes
  a pixel portion configured to convert light into an electric signal,
  a substrate where said pixel portion is formed,
  an optical communication unit configured to convert a signal read out from said pixel portion into an optical signal, and outputs the optical signal, which is disposed in one surface where said pixel portion is formed of said substrate, and
  a light shielding portion configured to shield, of signal light to be output from said optical communication unit, light that directs to said pixel portion, and light to be leaked from said optical communication unit, which is disposed around said optical communication unit.

* * * * *